(12) United States Patent
Nishimori et al.

(10) Patent No.: US 8,987,075 B2
(45) Date of Patent: Mar. 24, 2015

(54) METHOD FOR MANUFACTURING A COMPOUND SEMICONDUCTOR DEVICE

(71) Applicant: Fujitsu Limited, Kawasaki-shi, Kanagawa (JP)

(72) Inventors: Masato Nishimori, Kawasaki (JP); Atsushi Yamada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 30 days.

(21) Appl. No.: 13/916,469

(22) Filed: Jun. 12, 2013

(65) Prior Publication Data

US 2013/0280869 A1 Oct. 24, 2013

Related U.S. Application Data

(62) Division of application No. 13/195,190, filed on Aug. 1, 2011, now Pat. No. 8,507,949.

(30) Foreign Application Priority Data

Aug. 23, 2010 (JP) ................................. 2010-186461

(51) Int. Cl.
*H01L 21/338* (2006.01)
*H01L 29/66* (2006.01)
(Continued)

(52) U.S. Cl.
CPC ...... *H01L 29/66431* (2013.01); *H01L 29/0657* (2013.01); *H01L 29/4175* (2013.01); *H01L 29/66462* (2013.01); *H01L 29/7787* (2013.01); *H01L 29/2003* (2013.01)
USPC .... 438/172; 257/183; 257/192; 257/E21.371; 257/E21.387; 257/E21.403; 257/E21.407; 257/E21.246; 257/E29.252; 257/E29.253

(58) Field of Classification Search
CPC ............ H01L 29/0657; H01L 29/2003; H01L 29/4175; H01L 29/66431; H01L 29/66462; H01L 29/7787
USPC .................. 438/172; 257/183, 192, E21.371, 257/E21.387, E21.403, E21.407, E21.246, 257/E29.252, E29.253
See application file for complete search history.

(56) References Cited

U.S. PATENT DOCUMENTS 5,236,854 A  8/1993 Higaki
5,652,451 A  7/1997 Andoh
(Continued)

FOREIGN PATENT DOCUMENTS

JP  6-120259 A  4/1994
JP  7-321343 A  12/1995
(Continued)

OTHER PUBLICATIONS

Notification of Reasons for Refusal issued Jul. 29, 2014 by the Japanese Patent Office in counterpart application No. 2010-186461 with English translation.

*Primary Examiner* — Jay C Kim
(74) *Attorney, Agent, or Firm* — Kratz, Quintos & Hanson, LLP

(57) ABSTRACT

A semiconductor device includes a substrate, a carrier transit layer disposed above the substrate, a compound semiconductor layer disposed on the carrier transit layer, a source electrode disposed on the compound semiconductor layer, a first groove disposed from the back of the substrate up to the inside of the carrier transit layer while penetrating the substrate, a drain electrode disposed in the inside of the first groove, a gate electrode located between the source electrode and the first groove and disposed on the compound semiconductor layer, and a second groove located diagonally under the source electrode and between the source electrode and the first groove and disposed from the back of the substrate up to the inside of the carrier transit layer while penetrating the substrate.

5 Claims, 39 Drawing Sheets

(51) Int. Cl.
  *H01L 29/06* (2006.01)
  *H01L 29/417* (2006.01)
  *H01L 29/778* (2006.01)
  *H01L 29/20* (2006.01)

(56) References Cited

U.S. PATENT DOCUMENTS 7,560,752 B2   7/2009   Akamatsu
8,564,028 B2 * 10/2013  Iwamuro ..................... 257/260

2006/0231861 A1   10/2006  Akamatsu
2008/0135854 A1   6/2008   Akamatsu
2011/0006345 A1   1/2011   Ota et al.

FOREIGN PATENT DOCUMENTS

| JP | 8-78436 A | 3/1996 |
| JP | 2006-269939 A1 | 10/2006 |
| JP | 2007-128994 A1 | 5/2007 |
| JP | 2007-180330 A | 7/2007 |
| JP | WO 2009/110254 A1 | 9/2009 |

* cited by examiner

METHOD FOR MANUFACTURING A COMPOUND SEMICONDUCTOR DEVICE

CROSS-REFERENCE TO RELATED APPLICATIONS

This application is a Divisional Application of Ser. No. 13/195,190 filed on Aug. 1, 2011, which is based upon and claims the benefit of priority from the prior Japanese Patent Application or 2010-186461, filed on Aug. 23, 2010, the entire contents of both of which are incorporated herein by reference.

FIELD

The present invention relates to a semiconductor device and a method for manufacturing the same.

BACKGROUND

In recent years, a GaN based high electron mobility transistor (HEMT), in which an AlGaN/GaN hetero junction is utilized and GaN is used as a carrier transit layer, has been actively developed. Gallium nitride is a material having a wide band gap, high breakdown field strength, and a large saturation electron velocity and, therefore, is a very promising material capable of realizing a large current, a high voltage, and a low on-resistance operation. Development to apply GaN to a next-generation high efficiency amplifier used in a base station and the like and a high efficiency switching element to control an electric power has been actively performed.

A dielectric breakdown voltage is an important parameter of a semiconductor device used as the high efficiency amplifier or the high efficiency switching element. The dielectric breakdown voltage is a maximum voltage, which can be applied between a source electrode and a drain electrode included in a semiconductor device. If a voltage exceeding the dielectric breakdown voltage is applied, the semiconductor device is broken. In particular, a semiconductor device serving as the high efficiency switching element to control an electric power is required to have a high dielectric breakdown voltage because several hundred volts of voltage is applied.

However, regarding a semiconductor device having the HEMT structure illustrated in FIG. 16, it is difficult to obtain a high dielectric breakdown voltage. In the semiconductor device having the HEMT structure illustrated in FIG. 16, an i-GaN layer 101, an AlGaN layer 102, and an n-GaN layer 103 are disposed sequentially on a substrate 100. Furthermore, in the semiconductor device having the HEMT structure illustrated in FIG. 16, a source electrode 104 and a drain electrode 105 are disposed on the AlGaN layer 102, and a gate electrode 106 is disposed on the n-GaN layer 103.

Regarding the semiconductor device having the HEMT structure illustrated in FIG. 16, several volts of voltage is applied to the gate electrode 106, and several hundred volts of voltage is applied to the drain electrode 105. Therefore, a potential difference between the drain electrode 105 and the gate electrode 106 is large, so that a large electric field is applied on a protective layer 107 disposed on the n-GaN layer 103. As for the protective layer 107, a SiN film is used in general. The dielectric breakdown voltage of the SiN film is low and; therefore, in the case where a large electric field is applied to the SiN film, the SiN film is broken. As a result, reduction in dielectric breakdown voltage of the whole semiconductor device occurs. Regarding the SiN film, film formation through thermal nitridation is difficult, and film formation is performed by a CVD method. The SiN film formed by the CVD method has poor film quality, so that the dielectric breakdown voltage of the SiN film is reduced. Like the SiN film, the dielectric breakdown voltage of a $SiO_2$ film serving as an interlayer insulating film is low, so that in the case where a large electric field is applied to the $SiO_2$ film, the $SiO_2$ film is broken.

The potential of a wiring connected to the drain electrode 105 becomes very high. Consequently, potential differences between the wiring connected to the drain electrode 105 and a wiring connected to the source electrode 104 or the gate electrode 106 becomes large. As a result, it is necessary that the distances between the individual wirings are increased in order to prevent breakdown of the interlayer insulating films due to application of very high voltages to the interlayer insulating films between the individual wirings. Regarding the semiconductor device having the HEMT structure illustrated in FIG. 16, it is necessary to increase the distances between the individual wirings and; therefore, the flexibility in wiring is reduced, and an increase in chip area is provided.

For example, a method in which an improvement of dielectric breakdown voltage is attempted by disposing the gate electrode and the source electrode on the back of a substrate so as to increase the distance between the drain electrode and the source electrode has been known.

Related documents include Japanese Patent Laid-Open No. 2006-269939 and Japanese Patent Laid-Open No. 2007-128994.

SUMMARY

According to aspects of embodiments, a semiconductor device includes a substrate, a carrier transit layer disposed above the substrate, a compound semiconductor layer disposed on the carrier transit layer, a source electrode disposed on the compound semiconductor layer, a first groove disposed from the back of the substrate up to the inside of the carrier transit layer while penetrating the substrate, a drain electrode disposed in the inside of the first groove, a gate electrode located between the source electrode and the first groove and disposed on the compound semiconductor layer, and a second groove located diagonally under the source electrode and between the source electrode and the first groove and disposed from the back of the substrate up to the inside of the carrier transit layer while penetrating the substrate.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Preferred embodiments will be explained in reference to accompanying drawings.

A semiconductor device according to a form to execute the invention (hereafter referred to as an embodiment) and a method for manufacturing the same will be described below in reference to the drawings. The configurations of the following embodiments are provided as examples; and the present disclosure is not limited to the configurations of the embodiments.

Figure 1A:
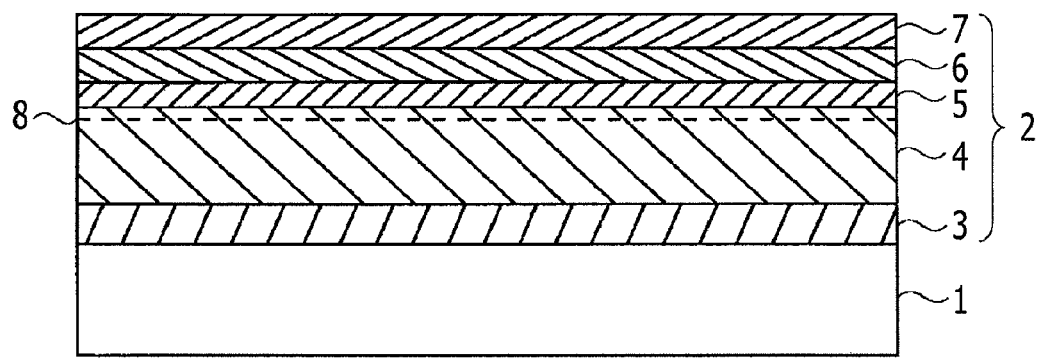
FIGS. 1A to 1H are production step diagrams of a semiconductor device according to a first embodiment.

A semiconductor device according to a first embodiment and a method for manufacturing the same will be described. The first embodiment is explained in reference to a semiconductor device having a GaN based HEMT structure. Initially, as illustrated in FIG. 1A, an epitaxial layer 2 is formed on the surface of a semiconductor substrate 1 by forming a GaN based compound semiconductor on the surface of the semiconductor substrate 1 through the use of a metal organic vapor phase epitaxy (MOVPE) apparatus in an atmosphere under reduced pressure. The semiconductor substrate 1 is, for example, a SiC substrate. However, the semiconductor substrate 1 is not limited to this and may be, for example, a silicon substrate, a sapphire substrate, a MgO substrate, or a ZnO substrate. The thickness of the semiconductor substrate 1 is, for example, about 350 μm.

The epitaxial layer 2 includes a core forming layer 3, a carrier transit layer 4, a spacer layer 5, a carrier supply layer 6, and a cap layer 7. The core forming layer 3 is, for example, AlN. The carrier transit layer 4 is, for example, i-GaN. The spacer layer 5 is, for example, i-AlGaN or i-InAlN. The carrier supply layer 6 is, for example, n-AlGaN or n-InAlN. The cap layer 7 is, for example, n-GaN. The spacer layer 5, the carrier supply layer 6, and the cap layer 7 are examples of compound semiconductor layers. In the carrier transit layer 4, a two-dimensional electron gas (2DEG) 8 is generated in the vicinity of the interface to the spacer layer 5. The epitaxial layer 2 may be a nitride semiconductor layer having the same function.

An example of formation of GaN based compound semiconductor on the semiconductor substrate 1 is described below. Initially, the semiconductor substrate 1 is carried into the MOVPE apparatus, and the semiconductor substrate 1 is heated. A trimethyl aluminum (TMAl) gas and an ammonia ($NH_3$) gas are passed into the MOVPE apparatus, AlN is epitaxially grown on the semiconductor substrate 1 and, thereby, the core forming layer 3 is formed on the semiconductor substrate 1. The film thickness of the core forming layer 3 is, for example, about 300 nm. However, the core forming layer 3 is not necessarily formed; and the formation of the core forming layer 3 may be omitted.

Subsequently, a trimethyl gallium (TMGa) gas and an $NH_3$ gas are passed into the MOVPE apparatus, i-GaN is epitaxially grown on the core forming layer 3 and, thereby, the carrier transit layer 4 is formed on the core forming layer 3. The film thickness of the carrier transit layer 4 is, for example, about 3 μm. In this regard, i-GaN is GaN not doped with an impurity intentionally.

A TMGa gas, a TMAl gas, and an $NH_3$ gas are passed into the MOVPE apparatus, i-$Al_{0.25}Ga_{0.75}N$ is epitaxially grown on the carrier transit layer 4 and, thereby, the spacer layer 5 is formed on the carrier transit layer 4. The ratio of aluminum (Al) to gallium (Ga) of i-$Al_{0.25}Ga_{0.75}N$ may be other values. The film thickness of the spacer layer 5 is, for example, about 5 nm. In this regard, i-AlGaN is AlGaN not doped with an impurity intentionally.

A TMGa gas, a TMAl gas, an $NH_3$ gas, and a silane ($SiH_4$) gas are passed into the MOVPE apparatus. Consequently, n-$Al_{0.25}Ga_{0.75}N$ is epitaxially grown on the spacer layer 5 and, thereby, the carrier supply layer 6 having band gap energy larger than that of the carrier transit layer 4 is formed on the spacer layer 5. The ratio of Al to Ga of n-$Al_{0.25}Ga_{0.75}N$ may be other values. The film thickness of the carrier supply layer 6 is, for example, about 30 nm. In this regard, n-AlGaN is AlGaN doped with an n-type impurity. For example, silicon (Si) is used as the n-type impurity and the impurity concentration is about $2 \times 10^{18}/cm^3$.

Diffusion of the n-type impurity contained in the carrier supply layer 6 into the carrier transit layer 4 is prevented by the spacer layer 5. Scattering of the carrier in the carrier transit layer 4 by the impurity can be suppressed and, thereby, an increase in output of the device due to an increase in mobility of the carrier can be facilitated. However, in the case where scattering of the carrier in the carrier transit layer 4 does not matter, formation of the spacer layer 5 may be omitted and the carrier supply layer 6 may be formed directly on the carrier transit layer 4.

A TMGa gas, an $NH_3$ gas, and a $SiH_4$ gas are passed into the MOVPE apparatus, n-GaN is epitaxially grown on the carrier supply layer 6 and, thereby, the cap layer 7 is formed on the carrier supply layer 6. The film thickness of the cap layer 7 is, for example, about 6 nm. In this regard, n-GaN is GaN doped with an n-type impurity. For example, Si is used as the n-type impurity and the impurity concentration is about $2 \times 10^{18}/cm^3$.

According to the above-described steps, the epitaxial layer 2 is formed on the semiconductor substrate 1 and, thereby, an epitaxial substrate is formed. The epitaxial substrate includes the semiconductor substrate 1 and the epitaxial layer 2.

Figure 1B:
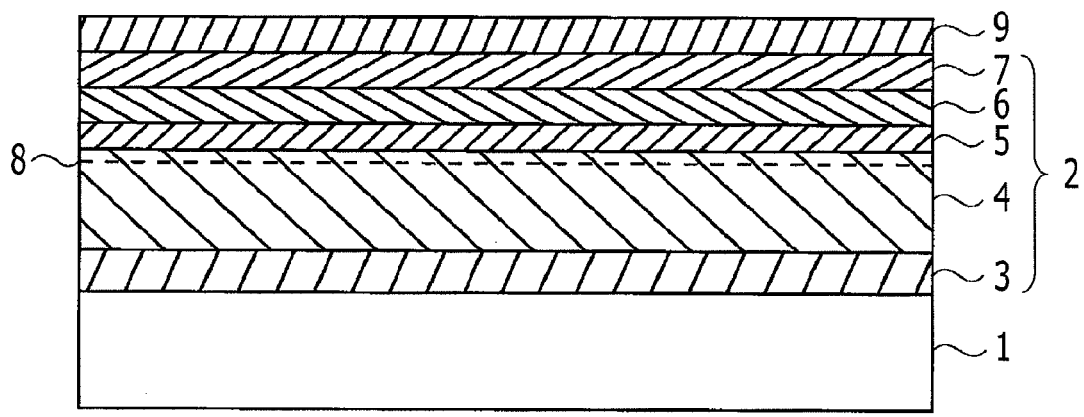

Next, as illustrated in FIG. 1B, a protective film 9 is formed on the cap layer 7 by using a chemical vapor deposition (CVD) method. The protective film 9 is, for example, SiN. The film thickness of the protective film 9 is, for example, about 500 nm. The protective film 9 protects the epitaxial layer 2.

A resist is applied to the protective film 9. A photomask is used, ultraviolet rays are applied to a source electrode forming region, and the resist is developed, so that an opening is formed in the resist. The resist provided with the opening is used as a mask, and an opening for the source electrode is formed in the protective film 9 through dry etching by using a fluorine based gas, e.g., $CF_4$ or $CF_6$. Then, the resist provided with the opening is used as a mask, and an opening for the source electrode is formed in the cap layer 7 through dry etching by using an inert gas and a chlorine based gas, e.g., a $Cl_2$ gas.

Figure 1C:
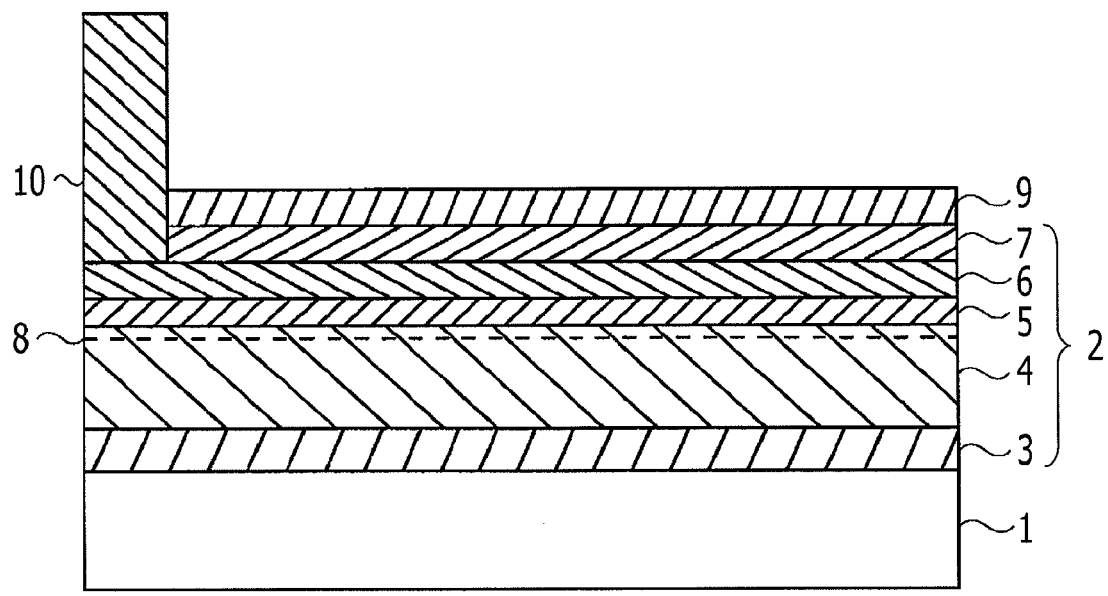

In an atmosphere under reduced pressure, tantalum (Ta) and Al are formed in the opening for the source electrode by an evaporation method. The film thickness of Ta is, for example, about 20 nm; and the film thickness of Al is, for example, about 200 nm. Subsequently, as illustrated in FIG. 1C, the resist is removed (lifted off) and, thereby, a source electrode 10 is formed on the carrier supply layer 6. The example in which the source electrode 10 is formed on the carrier supply layer 6 has been explained, but the source electrode 10 may be formed on the cap layer 7 without removing a part of the cap layer 7.

A resist is applied to the protective film 9. A photomask is used, ultraviolet rays are applied to a gate electrode forming region, and the resist is developed, so that an opening is formed in the resist. The resist provided with the opening is used as a mask; and an opening for the gate electrode is formed in the protective film 9 through dry etching by using a fluorine based gas, e.g., $CF_4$ or $CF_6$.

Figure 1D:
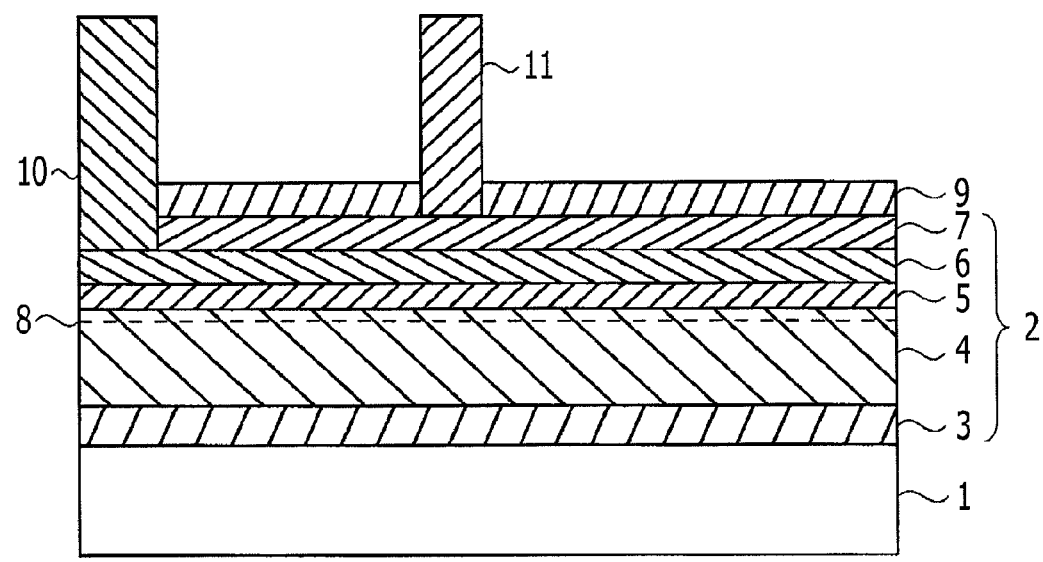

In an atmosphere under reduced pressure, Ti and Au are formed in the opening for the gate electrode by the evaporation method. The film thickness of Ti is, for example, about 10 nm, and the film thickness of Au is, for example, about 200 nm. Subsequently, as illustrated in FIG. 1D, the resist is removed (lifted off) and, thereby, a gate electrode 11 is formed on the cap layer 7. Here, Ti and Au are used as the materials for the gate metals, but metals other than Ti and Au may be used as the materials for the gate electrode 11.

The semiconductor substrate 1 is turned upside down; and a resist is applied to the back of the semiconductor substrate 1. A photomask is used, and ultraviolet rays are applied to a drain electrode forming region and a current inhibition groove forming region, so that an opening for drain electrode forming groove and an opening for current inhibition groove are formed in the resist.

Figure 1E:
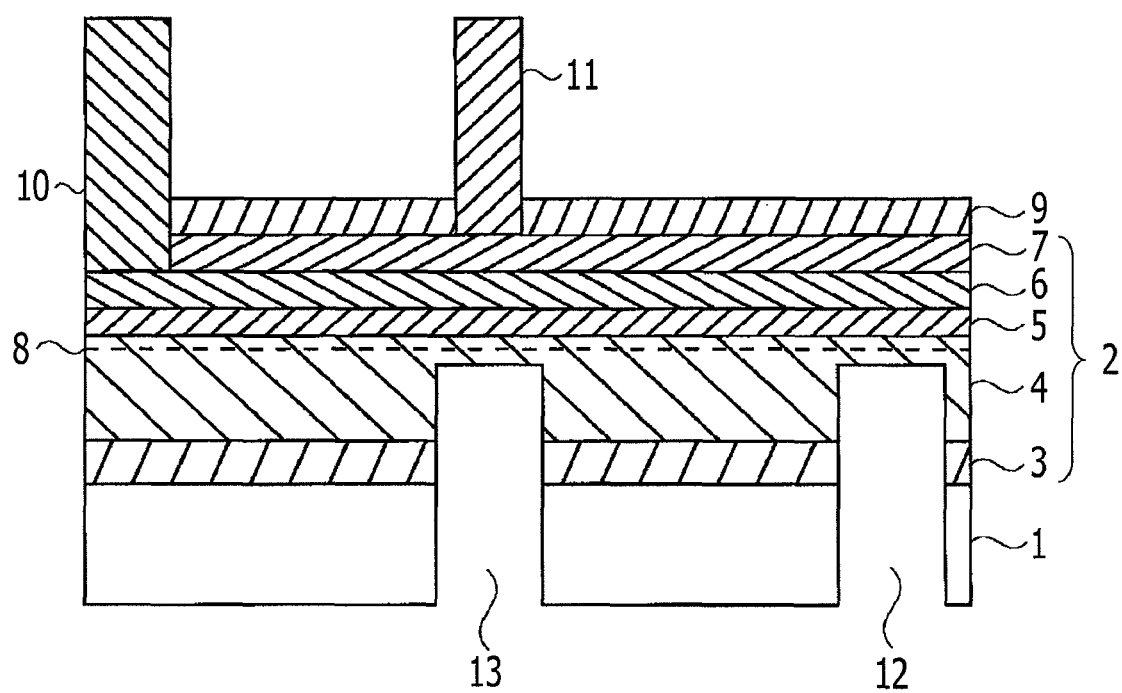

The resist formed on the back of the semiconductor substrate 1 is used as a mask, while dry etching is performed by using an inert gas and a chlorine based gas, e.g., a $Cl_2$ gas. As illustrated in FIG. 1E, by performing the dry etching, a drain electrode forming groove 12 and a current inhibition groove 13 are formed in the semiconductor substrate 1, the core forming layer 3, and the carrier transit layer 4. The drain electrode forming groove 12 is an example of a first groove. The current inhibition groove 13 is an example of a second groove. The drain electrode forming groove 12 and the current inhibition groove 13 are formed in the semiconductor substrate 1, the core forming layer 3, and the carrier transit layer 4 at the same time by the same etching step. An etching damage can be reduced because the drain electrode forming groove 12 and the current inhibition groove 13 are formed at the same time by one etching step. The depth of the drain electrode forming groove 12 and the depth of the current inhibition groove 13 are at the same level. Regarding the dry etching at this time, for example, the antenna power is specified to be about 200 W, and the bias power is specified to be about 30 W. The diameter of the current inhibition groove 13 is preferably 10 nm or more, and 10 μm or less. In FIG. 1E, the resist formed on the back of the semiconductor substrate 1 is not illustrated.

In the example illustrated in FIG. 1E, the current inhibition groove 13 is formed at the position just below the gate electrode 11, although not limited to this. The position of formation of the current inhibition groove 13 may be changed. For example, the current inhibition groove 13 may be formed in the vicinity of the position just below the gate electrode 11.

The drain electrode forming groove 12 is a groove formed in a region in which a drain electrode is disposed. The drain electrode forming groove 12 is formed up to the inside of the carrier transit layer 4 while penetrating the semiconductor substrate 1 and the core forming layer 3 and is terminated in the inside of the carrier transit layer 4.

The current inhibition groove 13 is a groove to prevent a current from passing under a depletion layer generated just below the gate electrode 11. The current inhibition groove 13 is formed up to the inside of the carrier transit layer 4 while penetrating the semiconductor substrate 1 and the core forming layer 3 and is terminated in the inside of the carrier transit layer 4.

The resist disposed on the back of the semiconductor substrate 1 is removed. Thereafter, a fresh resist is applied to the back of the semiconductor substrate 1. A photomask is used, and ultraviolet rays are applied to a drain electrode forming region, so that an opening for drain electrode is formed in the resist.

Figure 1F:
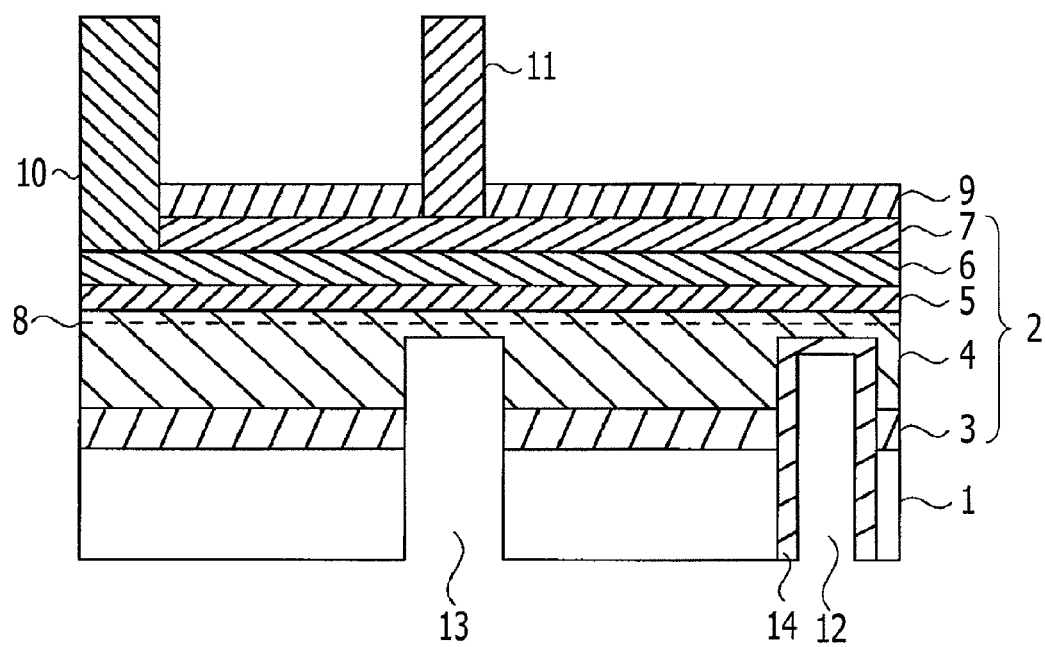

In an atmosphere under reduced pressure, Ti and Al are formed in the drain electrode forming groove 12 by the evaporation method. The film thickness of Ti is, for example, about 10 nm, and the film thickness of Al is, for example, about 200 nm. Subsequently, as illustrated in FIG. 1F, the resist is removed (lifted off) and, thereby, a drain electrode 14 is formed in the drain electrode forming groove 12. That is, the drain electrode 14 is formed in the inside of the semiconductor substrate 1, in the inside of the core forming layer 3, and in the inside of the carrier transit layer 4. The drain electrode 14 may be flattened by a chemical mechanical polishing (CMP) method, as necessary.

The current inhibition groove 13 is formed on the back side of the semiconductor substrate 1 and, thereby, the thickness of a part of the carrier transit layer 4 is reduced. If the thickness of the carrier transit layer 4 is excessively reduced, carriers of a two-dimensional electron gas 8 of the carrier transit layer 4 are reduced and there is a possibility that a current does not pass the carrier transit layer 4 with a reduced film thickness when the transistor is on. Furthermore, if the thickness of the carrier transit layer 4 is excessively reduced, carriers of the two-dimensional electron gas 8 of the carrier transit layer 4 are reduced and there is a possibility that good continuity between the source electrode 10 and the drain electrode 14 is not ensured when the transistor is on. Meanwhile, if the thickness of the carrier transit layer 4 is not reduced, a current may pass between the depletion layer generated just below the gate electrode 11 and the current inhibition groove 13 when the transistor is off.

The film thickness of the carrier transit layer 4 with a reduced film thickness is set in such a way that good continuity between the source electrode 10 and the drain electrode 14 is ensured when the transistor is on and a current does not pass between the depletion layer generated just below the gate electrode 11 and the current inhibition groove 13 when the transistor is off. For example, in the case where the film thickness of the carrier transit layer 4 with a reduced film thickness is specified to be 1,000 Å, it is possible to ensure the good continuity between the source electrode 10 and the drain electrode 14 when the transistor is on and prevent a current from passing between the depletion layer generated just below the gate electrode 11 and the current inhibition groove 13 when the transistor is off. The film thickness of the carrier transit layer 4 with a reduced film thickness can be specified to be 1,000 Å A by setting the position of termination of the current inhibition groove 13 (bottom surface) at a distance of 1,000 Å from the interface between the spacer layer 5 and the carrier transit layer 4 in the direction of the carrier transit layer 4.

Then, a heat treatment is performed in a nitrogen atmosphere at 400° C. or higher, and 1,000° C. or lower (for example, about 600° C.), so that ohmic characteristics of the source electrode 10 and the drain electrode 14 are established.

The drain electrode 14 is formed in the inside of the carrier transit layer 4, so that it may be difficult to ensure ohmic contact. Therefore, the carrier transit layer 4 in the vicinity or the periphery of the drain electrode 14 forming region may be doped with Si ions and an activation annealing treatment may be performed. Consequently, even when the drain electrode 14 is formed in the inside of the carrier transit layer 4, ohmic contact is easily ensured. If the activation annealing treatment is performed after the source electrode 10 is formed, the source electrode 10 may be broken. Therefore, it is preferable that the doping of the carrier transit layer 4 with Si ions and the activation annealing treatment are performed after formation of the carrier transit layer 4 and before formation of the source electrode 10.

The semiconductor device illustrated in FIG. 1F includes the semiconductor substrate 1, the epitaxial layer 2, the protective film 9, the source electrode 10, the gate electrode 11, the drain electrode forming groove 12, the current inhibition groove 13, and the drain electrode 14. The gate electrode 11 is located between the source electrode 10 formed on the carrier supply layer 6 and the drain electrode forming groove 12 formed from the back of the semiconductor substrate 1 toward the inside of the semiconductor substrate 1 and is formed on the cap layer 7. The current inhibition groove 13 is located diagonally under the source electrode 10 and between the source electrode 10 and the drain electrode forming groove 12 and is formed from the back of the semiconductor substrate 1 up to the inside of the carrier transit layer 4 while penetrating the semiconductor substrate 1. The drain electrode forming groove 12 is located diagonally under the gate electrode 11 formed on the cap layer 7 and in the direction opposite to the direction of formation of the source electrode 10.

The source electrode 10 is formed on the surface side of the semiconductor substrate 1; the drain electrode 14 is formed on the back side of the semiconductor substrate 1; and the source electrode 10 and the drain electrode 14 are not formed on the same plane. Consequently, a high potential is present in a lower portion of the carrier transit layer 4. In the case where the drain electrode 14 is formed on the back side of the semiconductor substrate 1, a current passes in the lower portion of the carrier transit layer 4 easily as compared to that in the case where the source electrode 10 and the drain electrode 14 are formed on the surface side of the semiconductor substrate 1.

Figure 2:
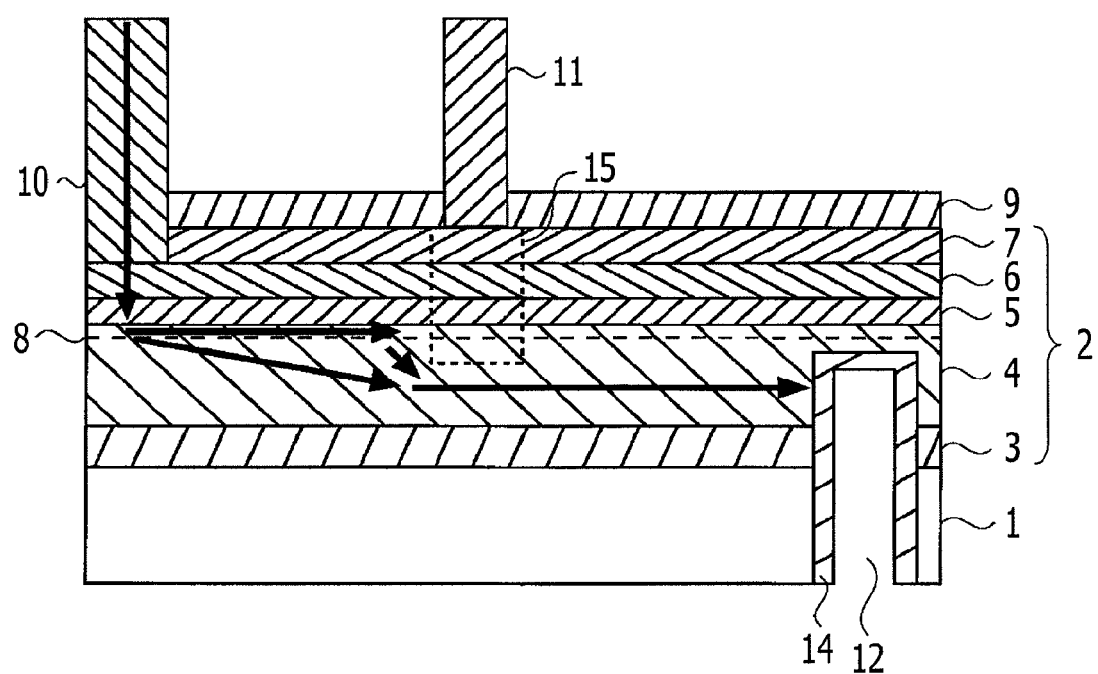
FIG. 2 is a diagram illustrating a semiconductor device not provided with a current inhibition groove.
Figure 3:
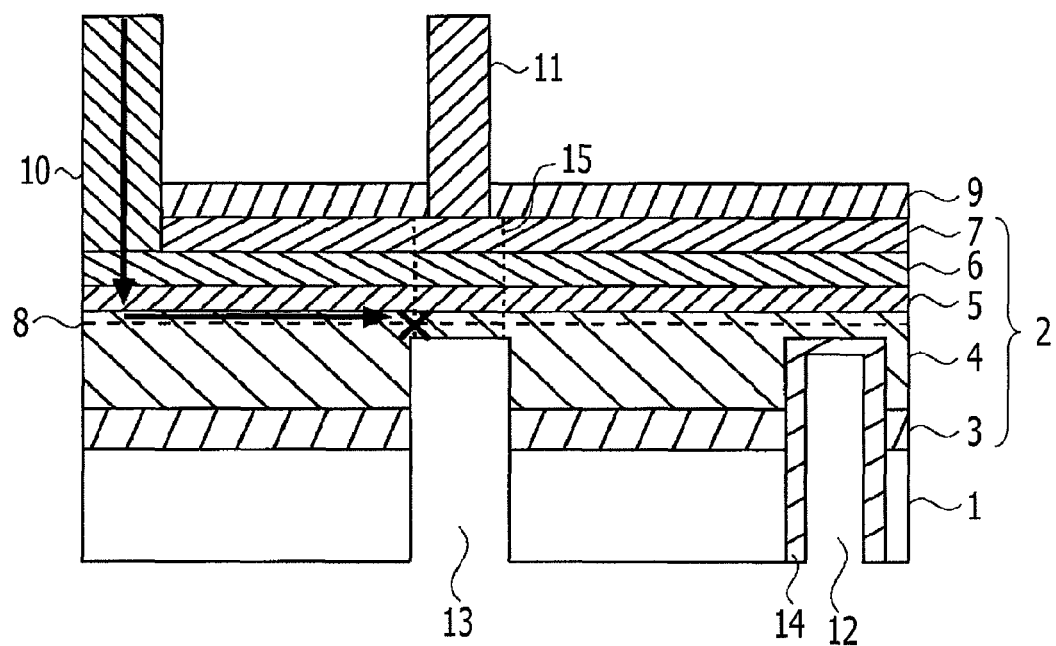
FIG. 3 is a diagram illustrating a semiconductor device provided with a current inhibition groove on the back side of a semiconductor substrate.

FIG. 2 is a diagram illustrating a semiconductor device in the case where the drain electrode 14 is disposed on the back side of the semiconductor substrate 1 and the current inhibition groove 13 is not disposed on the back side of the semiconductor substrate 1. As illustrated in FIG. 2, a current passes under the depletion layer 15 generated just below the gate electrode 11, so that a current may pass into the drain electrode 14 when the transistor is off. Meanwhile, in the case where the current inhibition groove 13 is disposed on the back side of the semiconductor substrate 1, as illustrated in FIG. 3, a current is prevented from passing into the drain electrode 14 by the depletion layer 15 generated just below the gate electrode 11 and the current inhibition groove 13 when the transistor is off. Thick arrows illustrated in FIGS. 2 and 3 indicate the flows of the currents.

As described above, the current inhibition groove 13 is disposed on the back side of the semiconductor substrate 1 and, thereby, the thickness of a part of the carrier transit layer 4 is reduced, so that a current is prevented from passing into the drain electrode 14 when the transistor is off. In the case where the current inhibition groove 13 is formed at the position just below the gate electrode 11 or in the vicinity of the position just below the gate electrode 11, the whole or a part of the carrier transit layer 4 with a reduced film thickness becomes a depletion layer when the transistor is off. Consequently, current does not pass under the depletion layer generated just below the gate electrode 11, and current is prevented from passing into the drain electrode 14 when the transistor is off.

Figure 1G:
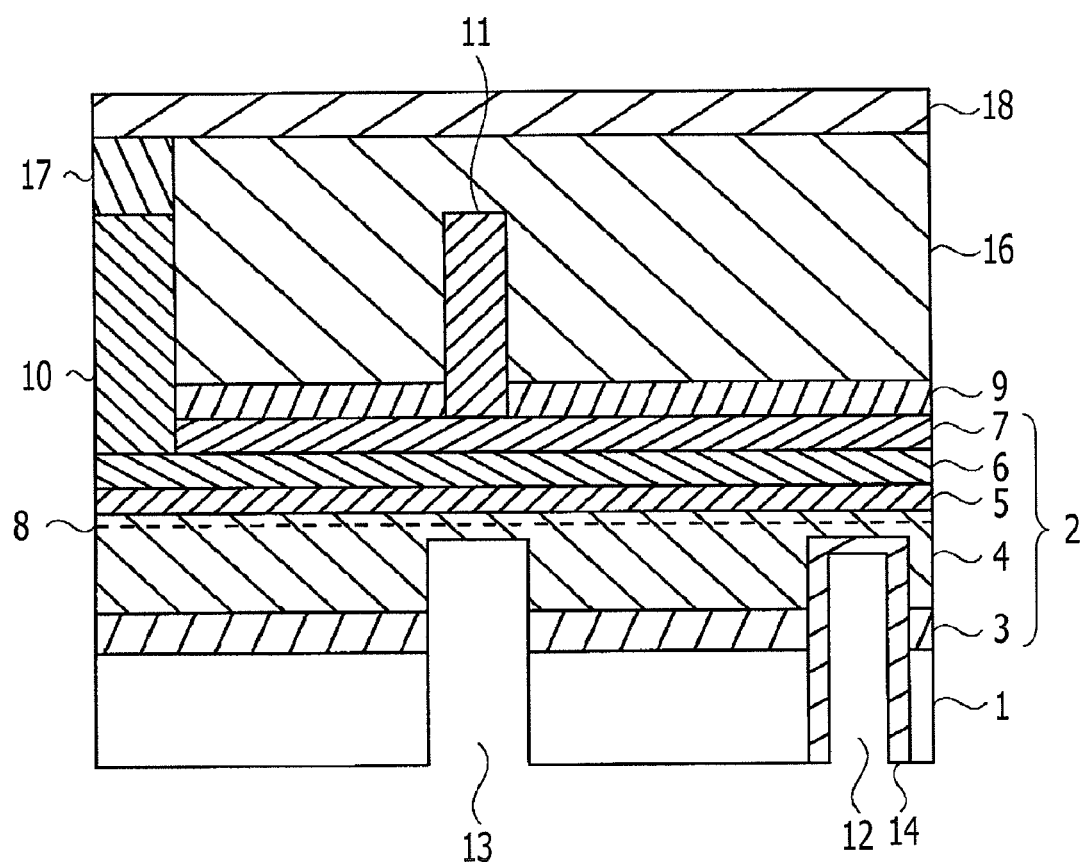

The explanation of production steps of the semiconductor device according to the first embodiment is hereby continued. After the step explained in reference to FIG. 1F is performed, an interlayer insulating film 16 is formed on the surface side of the semiconductor substrate 1 by using the CVD method, while the surface side of the semiconductor substrate 1 is faced upward. The interlayer insulating film 16 is, for example, $SiO_2$. The interlayer insulating film 16 is flattened by the CMP method. A contact hole is formed in the interlayer insulating film 16 through photolithography and etching. For example, tungsten (W) is deposited on the interlayer insulating film 16 and, thereafter, W is polished by the CMP method, so that a contact 17 is formed in the contact hole. As illustrated in FIG. 1G, a metal, e.g., Al or Cu, is deposited on the interlayer insulating film 16, and a wiring 18 connected to the source electrode 10 is formed on the interlayer insulating film 16 through photolithography and etching. A wiring connected to the gate electrode 11 is also formed in a manner similar to that of the wiring 18, although the wiring connected to the gate electrode 11 is not illustrated in the drawing.

The semiconductor substrate 1 is turned upside down, and a resist is applied to the back of the semiconductor substrate 1. A photomask is used, and ultraviolet rays are applied to a current inhibition groove 13 forming region, so that an opening is formed in the resist above the current inhibition groove 13.

Figure 1H:
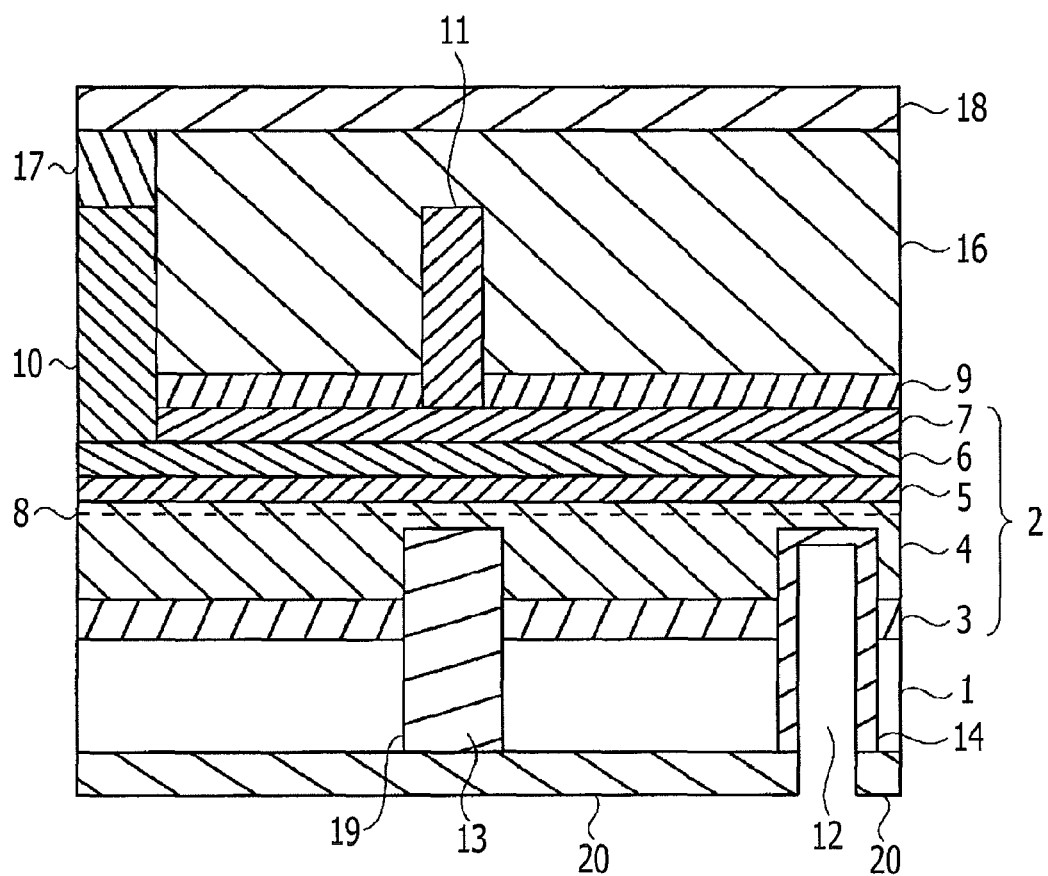

Then, SiN is formed through embedding into the current inhibition groove 13 by using the CVD method, and the resist is removed (lifted off), so that a current inhibition film 19 is formed in the current inhibition groove 13. As illustrated in FIG. 1H, a metal, e.g., Al or Cu, is deposited on the back of the semiconductor substrate 1; and a wiring 20 connected to the drain electrode 14 is formed on the back of the semiconductor substrate 1 through photolithography and etching. The wiring 18 is formed on the surface side of the semiconductor substrate 1 and the wiring 20 is formed on the back side of the semiconductor substrate 1. Therefore, the flexibility in wiring is increased and the chip area can be reduced.

If the wiring 20 is formed in the current inhibition groove 13, the distance between the gate electrode 11 and the wiring 20 is reduced, so that the breakdown voltage is reduced. Therefore, the current inhibition film 19 is formed in the current inhibition groove 13. The current inhibition film 19 formed in the current inhibition groove 13 prevents a current from passing under the depletion layer generated just below the gate electrode 11.

Regarding the semiconductor device according to the first embodiment, the drain electrode 14 is disposed on the back side of the semiconductor substrate 1 and, thereby, a high electric field is applied to a range diagonally under the gate electrode 11, so that application of a high electric field to the protective film 9 and the interlayer insulating film 16 can be suppressed. As a result, the dielectric breakdown voltage of the semiconductor device can be improved.

Figure 4:
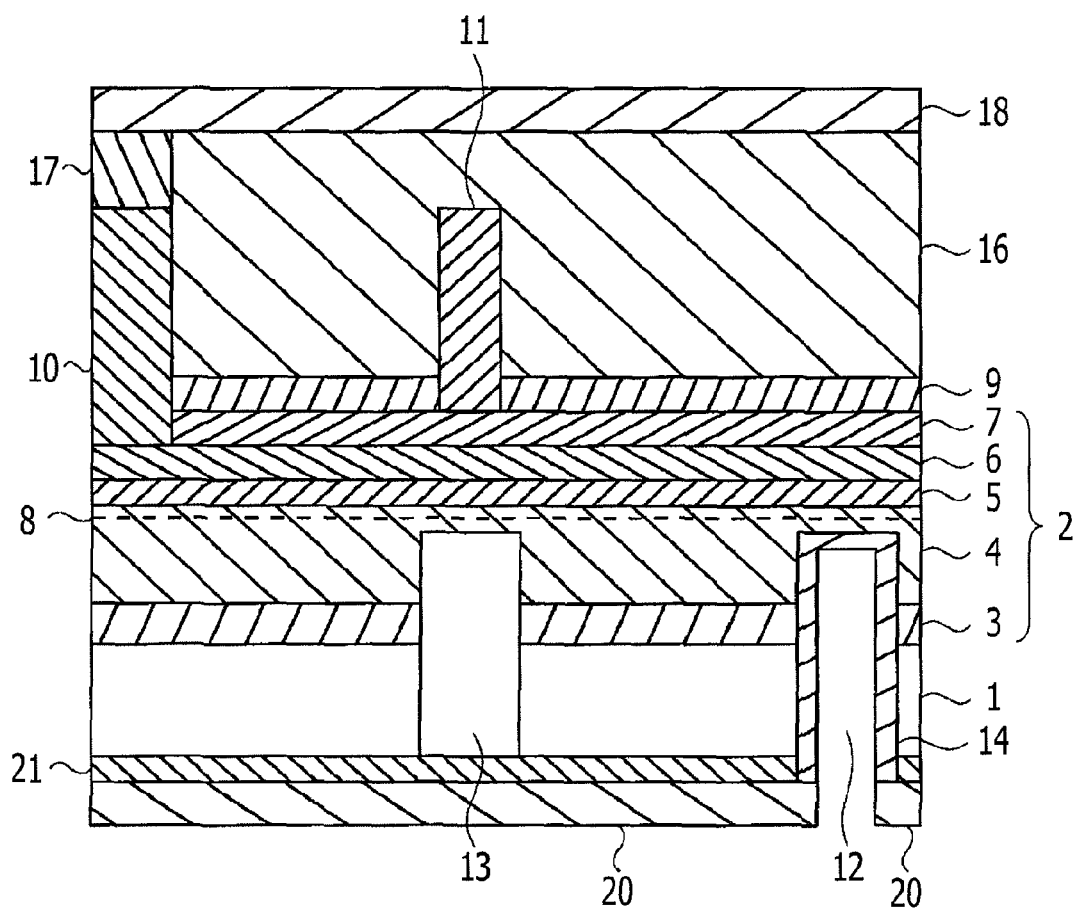
FIG. 4 is a sectional view of the semiconductor device according to the first embodiment in the case where the inside of a current inhibition groove is a space.

The inside of the current inhibition groove 13 may be a space, while the current inhibition film 19 is not disposed in the current inhibition groove 13. FIG. 4 is a sectional view of a semiconductor device in the case where the inside of the current inhibition groove 13 is a space. The semiconductor device illustrated in FIG. 4 includes a silicon carbide film 21, which has low step coverage ability relative to the base material, between the semiconductor substrate 1 and the wiring.

In the semiconductor device illustrated in FIG. 4, the inside of the current inhibition groove 13 is a space; and the inlet of the current inhibition groove 13 is covered with the silicon carbide film 21. The silicon carbide film 21 is, for example, SiC or SiOC. The silicon carbide film 21 having low step coverage ability is used and, therefore, the inlet of the current inhibition groove 13 is closed by the silicon carbide film 21 before the space in the current inhibition groove 13 is filled with the silicon carbide film 21. Formation of the silicon carbide film 21 may be performed in the step before the drain electrode 14 is formed or be performed in the step after the drain electrode 14 is formed.

The position of formation of the current inhibition groove 13 may be changed, as described below. For example, the current inhibition groove 13 may be formed between the position just below the gate electrode 11 and the position, at which the drain electrode 14 is disposed. In the case where the current inhibition groove 13 is formed between the position just below the gate electrode 11 and the position, at which the drain electrode 14 is disposed, a current is prevented from passing into the drain electrode 14 when the transistor is off, as in the case where the current inhibition groove 13 is formed at the position just below the gate electrode 11.

Alternatively, the position of formation of the current inhibition groove 13 can be brought close to the direction of the position just below the source electrode 10. However, if the distance between the depletion layer generated just below the gate electrode 11 and the current inhibition groove 13 is too large, a current may pass between the depletion layer generated just below the gate electrode 11 and the current inhibition groove 13. Therefore, in the case where the position of formation of the current inhibition groove 13 is brought close to the direction of the position just below the source electrode 10, it is preferable that the current inhibition groove 13 is formed at the position adjacent to the position just below the gate electrode 11.

A semiconductor device according to a second embodiment and a method for manufacturing the same will be described. The second embodiment is explained with reference to a semiconductor device having a GaN based HEMT structure. In this regard, the same constituents as those in the first embodiment are indicated by the same reference numerals as those in the first embodiment and explanations thereof will not be provided.

Regarding the method for manufacturing the semiconductor device according to the second embodiment, in the initial stage, the same steps as the steps explained in reference to FIGS. 1A to 4 are performed, although explanations thereof are omitted. Therefore, regarding the method for manufacturing the semiconductor device according to the second embodiment, explanations are started from the step after the steps explained with reference to FIGS. 1A to 4 in the first embodiment are performed.

After the same steps as the steps explained with reference to FIGS. 1A to 4 in the first embodiment are performed, the semiconductor substrate 1 is turned upside down, and a resist is applied to the back of the semiconductor substrate 1. A photomask is used, and ultraviolet rays are applied to a current inhibition groove forming region, so that an opening for current inhibition groove is formed in the resist.

Figure 5A:
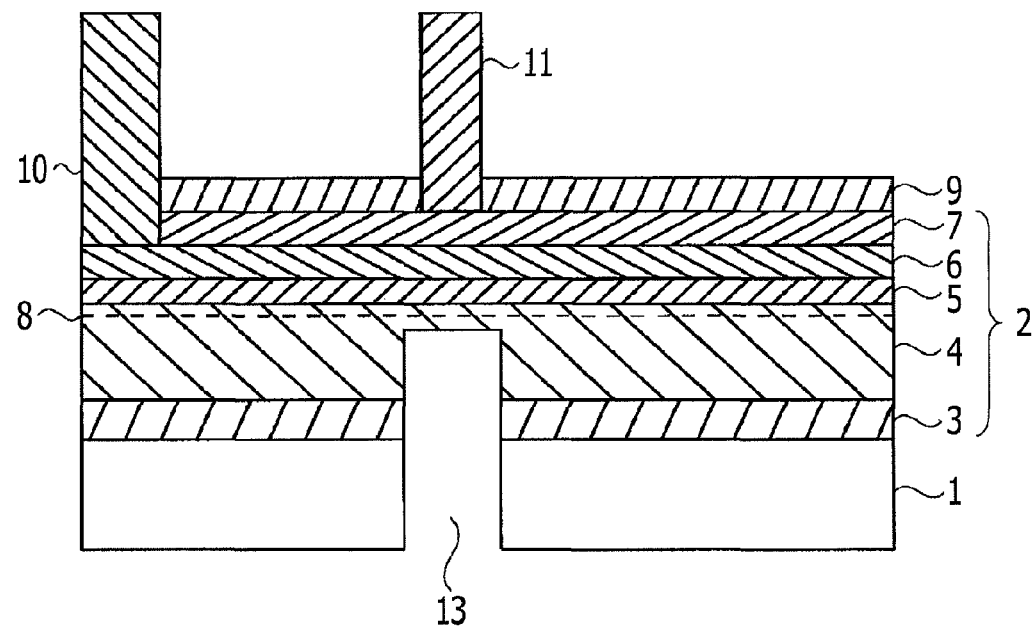
FIGS. 5A to 5E are production step diagrams of a semiconductor device according to a second embodiment.

The resist formed on the back of the semiconductor substrate 1 is used as a mask, and dry etching is performed by using an inert gas and a chlorine based gas, e.g., a $Cl_2$ gas. As illustrated in FIG. 5A, by performing the dry etching, a current inhibition groove 13 is formed in the semiconductor substrate 1, the core forming layer 3, and the carrier transit layer 4. Regarding the dry etching at this time, for example, the antenna power is specified to be about 200 W, and the bias power is specified to be about 30 W. The diameter of the current inhibition groove 13 is preferably 10 nm or more, and 10 μm or less. In FIG. 5A, the resist formed on the back of the semiconductor substrate 1 is not illustrated.

In the example illustrated in FIG. 5A, the current inhibition groove 13 is formed at the position just below the gate electrode 11, although not limited to this. The position of formation of the current inhibition groove 13 may be changed. For example, the current inhibition groove 13 may be formed in the vicinity of the position just below the gate electrode 11.

The current inhibition groove 13 is a groove to prevent a current from passing under a depletion layer generated just below the gate electrode 11. The current inhibition groove 13 is formed up to the inside of the carrier transit layer 4 while penetrating the semiconductor substrate 1 and the core forming layer 3 and is terminated in the inside of the carrier transit layer 4. As in the first embodiment, the position of termination of the current inhibition groove 13 (bottom surface) may be set at a distance of 1,000 Å from the interface between the spacer layer 5 and the carrier transit layer 4 in the direction of the carrier transit layer 4.

The resist disposed on the back of the semiconductor substrate 1 is removed. Thereafter, a fresh resist is applied to the back of the semiconductor substrate 1. A photomask is used, and ultraviolet rays are applied to a drain electrode forming region, so that an opening for drain electrode forming groove is formed in the resist.

Figure 5B:
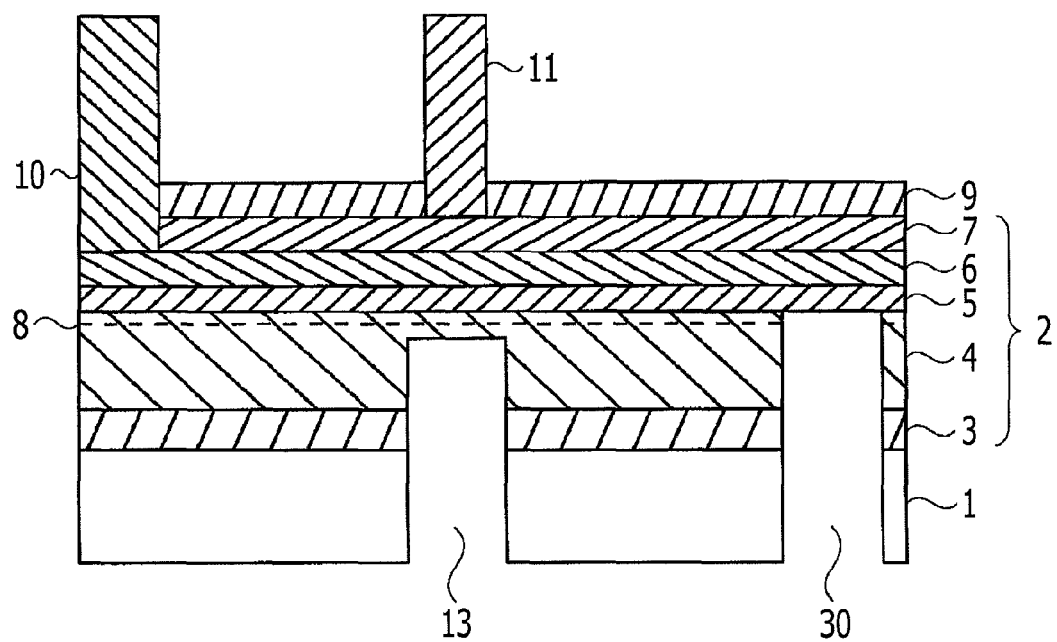

The resist formed on the back of the semiconductor substrate 1 is used as a mask; and dry etching is performed by using an inert gas and a chlorine based gas, e.g., a $Cl_2$ gas. As illustrated in FIG. 5B, by performing the dry etching, a drain electrode forming groove 30 is formed in the semiconductor substrate 1, the core forming layer 3, and the carrier transit layer 4. The drain electrode forming groove 30 is an example of the first groove. Regarding the dry etching at this time, for example, the antenna power is specified to be about 200 W, and the bias power is specified to be about 30 W. In FIG. 5B, the resist formed on the back of the semiconductor substrate 1 is not illustrated.

The drain electrode forming groove 30 is a groove formed in a region in which a drain electrode is disposed. The drain electrode forming groove 30 is formed up to the inside of the carrier transit layer 4 while penetrating the semiconductor substrate 1 and the core forming layer 3 and is terminated at the interface between the spacer layer 5 and the carrier transit layer 4. That is, the drain electrode forming groove 30 is formed up to a position deeper than that of the current inhibition groove 13 and reaches the spacer layer 5. In the example illustrated in FIG. 5B, the drain electrode forming groove 30 is terminated at the interface between the spacer layer 5 and the carrier transit layer 4, although not limited to this. The position of termination of the drain electrode forming groove 30 may be changed. For example, the position of termination of the drain electrode forming groove 30 may be specified to be in the vicinity of the interface between the spacer layer 5 and the carrier transit layer 4. Alternatively, the position of termination of the drain electrode forming groove 30 may be in the vicinity of the two-dimensional electron gas 8 of the carrier transit layer 4. Alternatively, the drain electrode forming groove 30 may, for example, be formed up to the inside of the spacer 5 while penetrating the semiconductor substrate 1, the core forming layer 3, and the carrier transit layer 4 and be terminated in the inside of the spacer layer 5.

The resist disposed on the back of the semiconductor substrate 1 is removed. Thereafter, a fresh resist is applied to the back of the semiconductor substrate 1. A photomask is used, and ultraviolet rays are applied to a drain electrode forming region, so that an opening for drain electrode is formed in the resist.

Figure 5C:
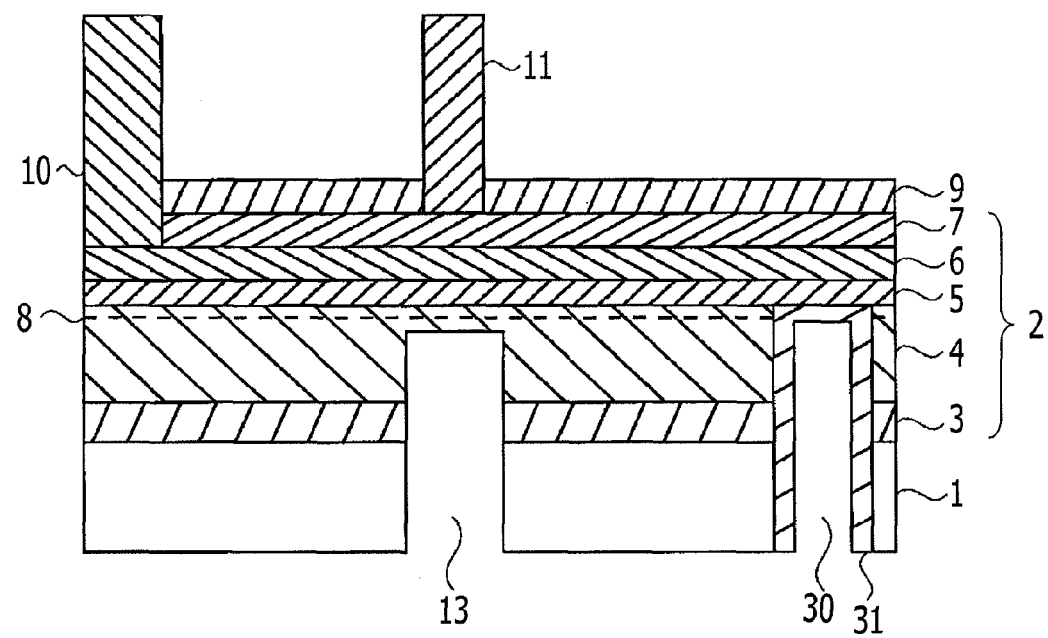

In an atmosphere under reduced pressure, Ti and Al are formed in the drain electrode forming groove 30 by the evaporation method. The film thickness of Ti is, for example, about 10 nm, and the film thickness of Al is, for example, about 200 nm. Subsequently, as illustrated in FIG. 5C, the resist is removed (lifted off) and, thereby, a drain electrode 31 is formed in the drain electrode forming groove 30. That is, the drain electrode 31 is formed in the inside of the semiconductor substrate 1, in the inside of the core forming layer 3, and in the inside of the carrier transit layer 4. The drain electrode 31 may be flattened by the CMP method, as necessary.

In the case where the drain electrode forming groove 30 is terminated at the interface between the spacer layer 5 and the carrier transit layer 4, the drain electrode 31 is formed up to the interface between the spacer layer 5 and the carrier transit layer 4. In the case where the drain electrode forming groove 30 is terminated at the vicinity of the interface between the spacer layer 5 and the carrier transit layer 4, the drain electrode 31 is formed up to the vicinity of the interface between the spacer layer 5 and the carrier transit layer 4. In the case where the drain electrode forming groove 30 penetrates the semiconductor substrate 1, the core forming layer 3, and the carrier transit layer 4 and where it is terminated in the inside of the spacer layer 5, the drain electrode 31 is formed up to the inside of the spacer layer 5.

As illustrated in FIG. 5C, the drain electrode 31 is in contact with the two-dimensional electron gas 8 of the carrier transit layer 4 and it is easy to ensure ohmic contact between the drain electrode 31 and the carrier transit layer 4. Furthermore, in the case where the position of termination of the drain electrode forming groove 30 is specified to be the vicinity of the two-dimensional electron gas 8 of the carrier transit layer 4, the drain electrode 31 and the two-dimensional electron gas 8 of the carrier transit layer 4 come close to each other, and it becomes easy to ensure ohmic contact between the drain electrode 31 and the carrier transit layer 4.

Then, a heat treatment is performed in a nitrogen atmosphere at 400° C. or higher, and 1,000° C. or lower (for example, about 600° C.), so that ohmic characteristics of the source electrode 10 and the drain electrode 31 are established.

The carrier transit layer 4 in the vicinity or the periphery of the drain electrode 31 forming region may be doped with Si ions and an activation annealing treatment may be performed. Consequently, even when the drain electrode 31 is formed in the inside of the carrier transit layer 4, ohmic contact is easily assured. If the activation annealing treatment is performed after the source electrode 10 is formed, the source electrode 10 may be broken. Therefore, it is preferable that the doping of the carrier transit layer 4 with Si ions and the activation annealing treatment are performed after formation of the carrier transit layer 4 and before formation of the source electrode 10.

The semiconductor device illustrated in FIG. 5C includes the semiconductor substrate 1, the epitaxial layer 2, the protective film 9, the source electrode 10, the gate electrode 11, the current inhibition groove 13, the drain electrode forming groove 30, and the drain electrode 31. The gate electrode 11 is located between the source electrode 10 formed on the carrier supply layer 6 and the drain electrode forming groove 30 formed from the back of the semiconductor substrate 1 toward the inside of the semiconductor substrate 1 and is formed on the cap layer 7. The current inhibition groove 13 is located diagonally under the source electrode 10 and between the source electrode 10 and the drain electrode forming groove 30 and is formed from the back of the semiconductor substrate 1 up to the inside of the carrier transit layer 4 while penetrating the semiconductor substrate 1. The drain electrode forming groove 30 is located diagonally under the gate electrode 11 formed on the cap layer 7 and in the direction opposite to the direction of formation of the source electrode 10.

Figure 5D:
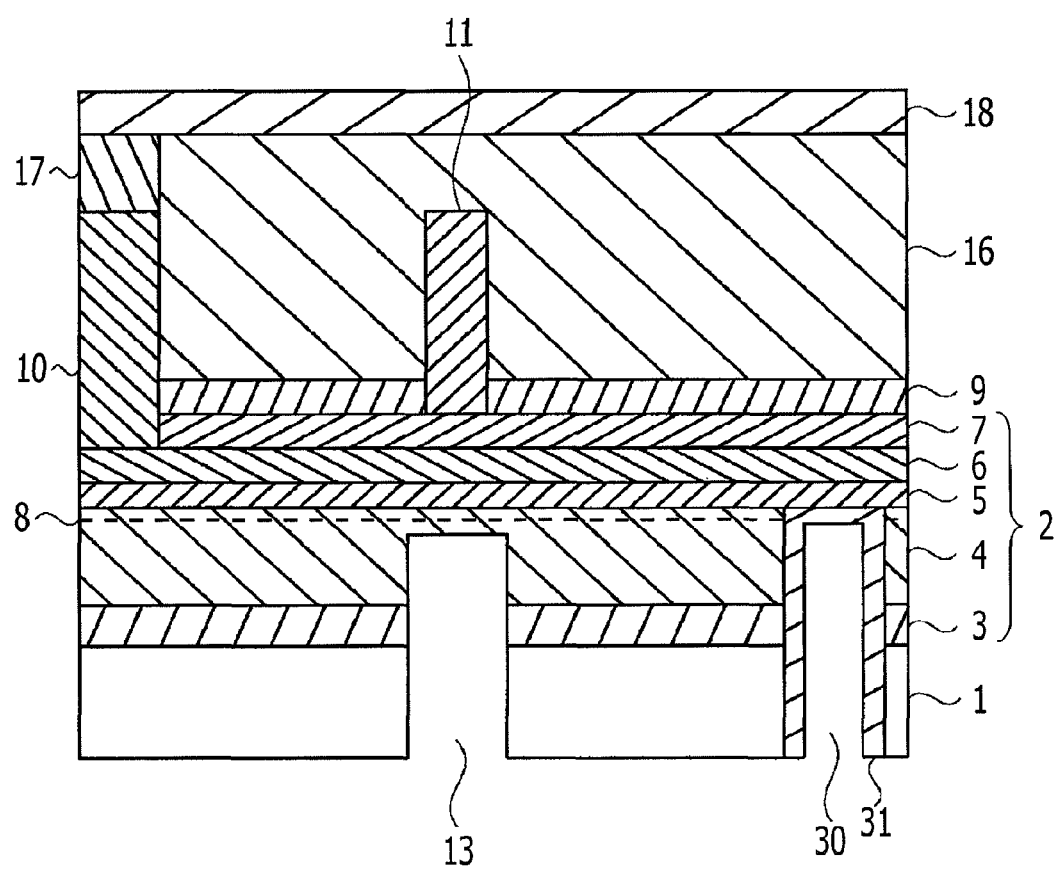

The interlayer insulating film 16 is formed on the surface side of the semiconductor substrate 1 by using the CVD method while the surface side of the semiconductor substrate 1 is faced upward. The interlayer insulating film 16 is, for example, $SiO_2$. The interlayer insulating film 16 is flattened by the CMP method. A contact hole is formed in the interlayer insulating film 16 through photolithography and etching. For example, W is deposited on the interlayer insulating film 16 and, thereafter, W is polished by the CMP method, so that a contact 17 is formed in the contact hole. As illustrated in FIG. 5D, a metal, e.g., Al or copper (Cu), is deposited on the interlayer insulating film 16, and a wiring 18 connected to the source electrode 10 is formed on the interlayer insulating film 16 through photolithography and etching. A wiring connected to the gate electrode 11 is also formed in a manner similar to that of the wiring 18, although the wiring connected to the gate electrode 11 is not illustrated in the drawing.

The semiconductor substrate 1 is turned upside down, and a resist is applied to the back of the semiconductor substrate 1. A photomask is used, and ultraviolet rays are applied to a current inhibition groove 13 forming region, so that an opening is formed in the resist above the current inhibition groove 13.

Figure 5E:
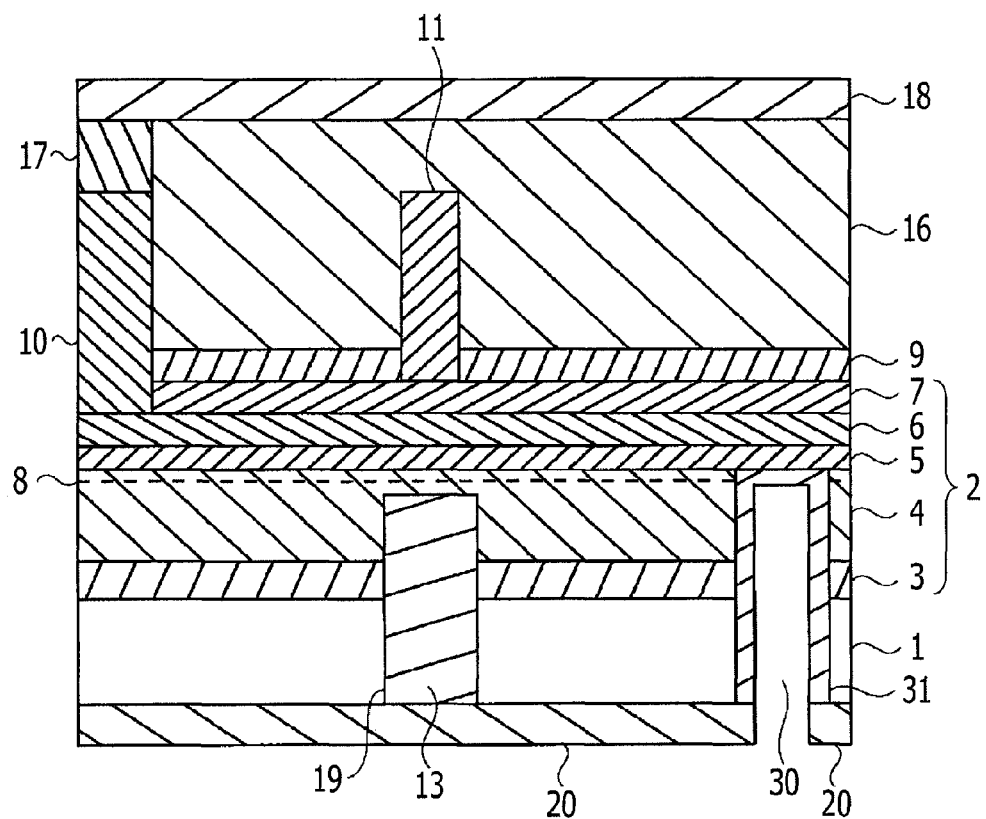

Then, SiN is formed through embedding into the current inhibition groove 13 by using the CVD method, and the resist is removed (lifted off), so that the current inhibition film 19 is formed in the current inhibition groove 13. As illustrated in FIG. 5E, a metal, e.g., Al or Cu, is deposited on the back of the semiconductor substrate 1; and the wiring 20 connected to the drain electrode 31 is formed on the back of the semiconductor substrate 1 through photolithography and etching. The wiring 18 is formed on the surface side of the semiconductor substrate 1 and the wiring 20 is formed on the back side of the semiconductor substrate 1. Therefore, the flexibility in wiring is increased and the chip area can be reduced.

If the wiring 20 is formed in the current inhibition groove 13, the distance between the gate electrode 11 and the wiring 20 is reduced, so that the breakdown voltage is reduced. Therefore, the current inhibition film 19 is formed in the current inhibition groove 13. The current inhibition film 19 formed in the current inhibition groove 13 prevents a current from passing under the depletion layer generated just below the gate electrode 11.

Regarding the semiconductor device according to the second embodiment, the drain electrode 31 is disposed on the back side of the semiconductor substrate 1 and, thereby, a high electric field is applied to a range diagonally under the gate electrode 11, so that application of a high electric field to the protective film 9 and the interlayer insulating film 16 can be suppressed. As a result, the dielectric breakdown voltage of the semiconductor device can be improved.

Figure 6:
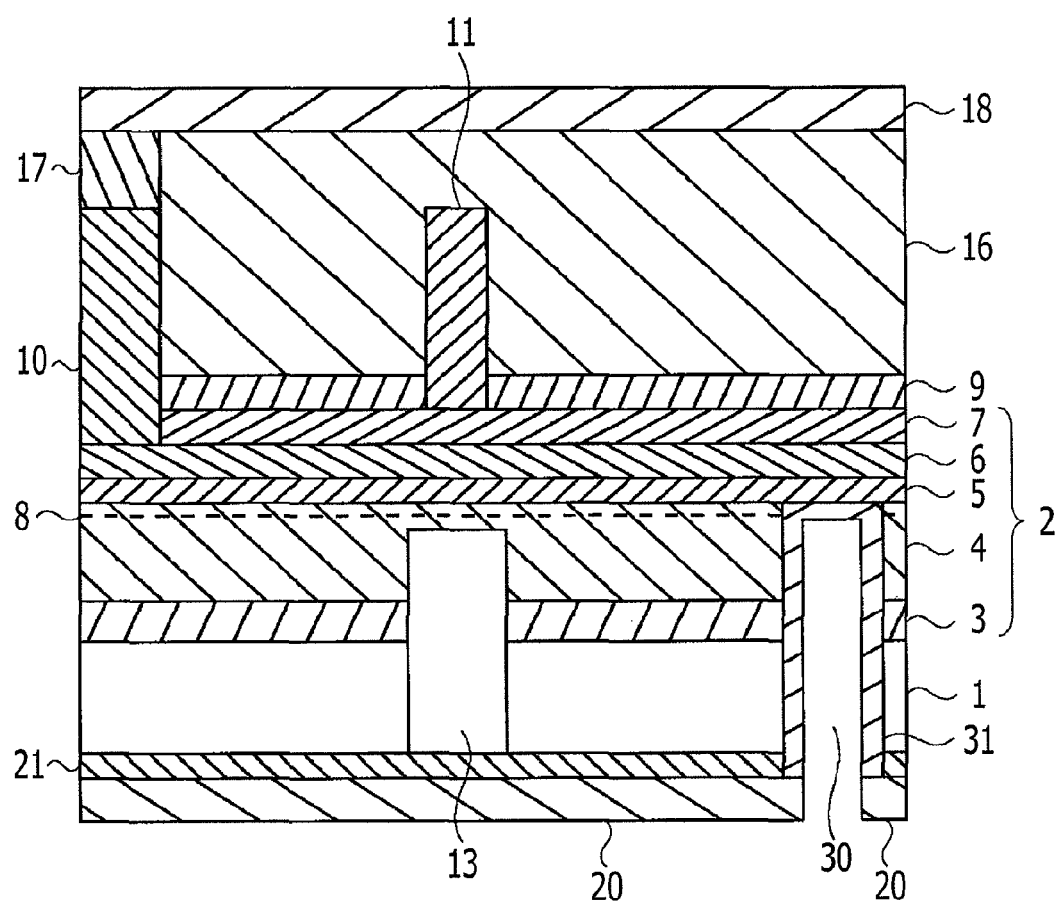
FIG. 6 is a sectional view of the semiconductor device according to the second embodiment in the case where the inside of a current inhibition groove is a space.

The inside of the current inhibition groove 13 may be a space without forming the current inhibition film 19 in the current inhibition groove 13, as in the first embodiment. FIG. 6 is a sectional view of a semiconductor device in the case where the inside of the current inhibition groove 13 is a space. The semiconductor device illustrated in FIG. 6 includes a silicon carbide film 21, which has low step coverage ability relative to the base material, between the semiconductor substrate 1 and the wiring.

In the semiconductor device illustrated in FIG. 6, the inside of the current inhibition groove 13 is a space, and the inlet of the current inhibition groove 13 is covered with the silicon carbide film 21. The silicon carbide film 21 is, for example, SiC or SiOC. The silicon carbide film 21 having low step coverage ability is used and, therefore, the inlet of the current inhibition groove 13 is closed by the silicon carbide film 21 before the space in the current inhibition groove 13 is filled with the silicon carbide film 21. Formation of the silicon carbide film 21 may be performed in the step before the drain electrode 31 is formed or be performed in the step after the drain electrode 31 is formed.

As illustrated in FIGS. 5A and 5B, the formation of the current inhibition groove 13 and the formation of the drain electrode forming groove 30 are performed in separate steps. That is, the etching step to form the current inhibition groove 13 and the etching step to form the drain electrode forming groove 30 are performed independently. However, formation of the current inhibition groove 13 and the drain electrode forming groove 30 may be performed in the same etching step and, thereafter, the drain electrode 31 forming region may be subjected to an additional etching step in such a way that the drain electrode forming groove 30 is terminated at the interface between the carrier transit layer 4 and the spacer layer 5.

Figure 7:
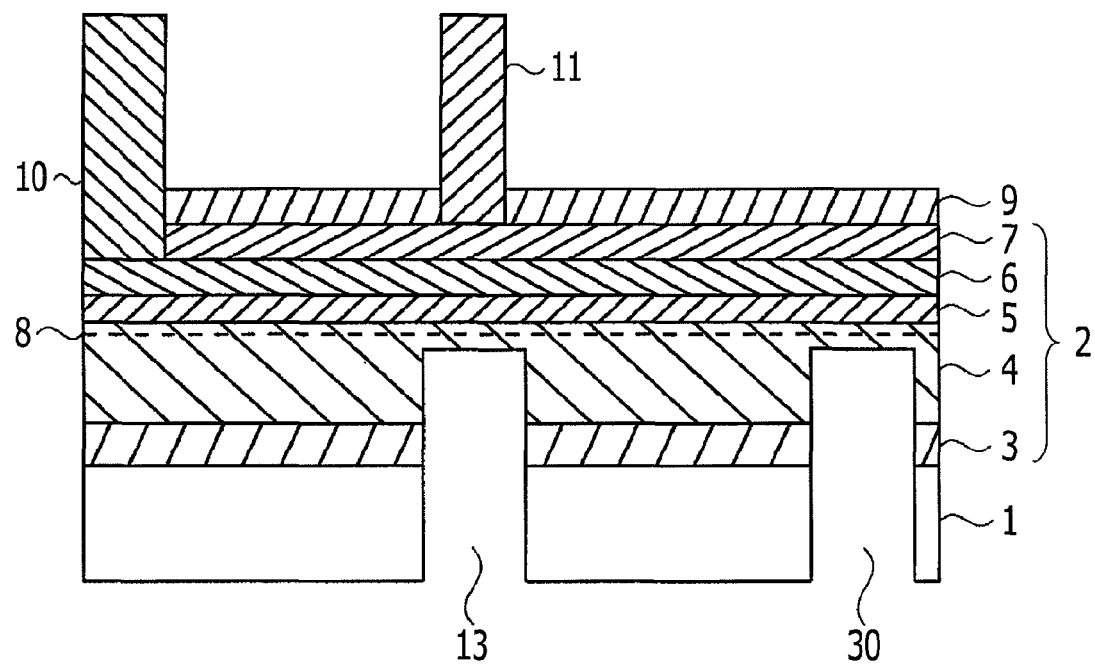
FIG. 7 is a sectional view of the semiconductor device according to the second embodiment in the case where the current inhibition groove and a drain electrode forming groove are formed having the same level of depths.

For example, as illustrated in FIG. 7, the current inhibition groove 13 and the drain electrode forming groove 30 are formed having the same level of depths by the same etching step. Subsequently, a resist is applied to the back of the semiconductor substrate 1. A photomask is used, and ultraviolet rays are applied to the drain electrode 31 forming region, so that an opening is formed in the resist. The drain electrode 31 forming region is subjected to an additional etching step to further dig the drain electrode forming groove 30, so that the drain electrode forming groove 30 is formed more deeply than is the current inhibition groove 13.

For example, the drain electrode forming groove 30 may penetrate the semiconductor substrate 1 and the core forming layer 3 and be terminated at the interface or in the vicinity of the interface between the spacer layer 5 and the carrier transit layer 4. Alternatively, the drain electrode forming groove 30 may penetrate the semiconductor substrate 1, the core forming layer 3, and the carrier transit layer 4 and may be terminated in the inside of the spacer layer 5. With regard to the dry etching in the additional etching step, for example, the antenna power is specified to be about 100 W, and the bias power is specified to be about 10 W. The etching rate of the dry etching in the additional etching step is reduced by reducing the etching power. In the case where the etching rate is reduced, etching proceeds in a stable manner, and the drain electrode forming groove 30 can be formed precisely. The etching rate of the dry etching in the additional etching step may be reduced by changing the gas species.

The drain electrode forming groove 30 is formed up to a deeper position of the carrier transit layer 4 as compared to that of the current inhibition groove 13 and, thereby, the drain electrode 31 and the two-dimensional electron gas 8 of the carrier transit layer 4 can be brought into contact with each other. The drain electrode forming groove 30 is formed up to the interface between the spacer layer 5 and the carrier transit layer 4 and, thereby, the drain electrode 31 and the two-dimensional electron gas 8 of the carrier transit layer 4 can be brought into contact with each other. In the case where the drain electrode 31 and the two-dimensional electron gas 8 of the carrier transit layer 4 are brought into contact with each other, the resistance between the drain electrode 31 and the carrier transit layer 4 is reduced and current easily passes into the drain electrode 31 when the transistor is on.

The drain electrode forming groove 30 is formed up to a deeper position of the carrier transit layer 4 as compared to that of the current inhibition groove 13 and, thereby, the distance of the drain electrode 31 from the two-dimensional electron gas 8 of the carrier transit layer 4 can be made smaller than that of the current inhibition groove 13. In the case where the drain electrode 31 and the two-dimensional electron gas 8 of the carrier transit layer 4 are brought close to each other, the resistance between the drain electrode 31 and the carrier transit layer 4 is reduced and current easily passes into the drain electrode 31 when the transistor is on.

The position of formation of the current inhibition groove 13 may be changed, as described below. For example, the current inhibition groove 13 may be formed between the position just below the gate electrode 11 and the position, at which the drain electrode 31 is disposed. In the case where the current inhibition groove 13 is formed between the position just below the gate electrode 11 and the position, at which the drain electrode 31 is disposed, a current is prevented from passing into the drain electrode 31 when the transistor is off, as in the case where the current inhibition groove 13 is formed at the position just below the gate electrode 11.

Alternatively, the position of formation of the current inhibition groove 13 can be brought close to the direction of the position just below the source electrode 10. However, if the distance between the depletion layer generated just below the gate electrode 11 and the current inhibition groove 13 is too large, current may pass between the depletion layer generated just below the gate electrode 11 and the current inhibition groove 13. Therefore, in the case where the position of formation of the current inhibition groove 13 is brought close to the direction of the position just below the source electrode 10, it is preferable that the current inhibition groove 13 is formed at the position adjacent to the position just below the gate electrode 11.

A semiconductor device according to a third embodiment and a method for manufacturing the same will be described. The third embodiment is explained with reference to a semiconductor device having a GaN based HEMT structure. In this regard, the same constituents as those in the first embodiment are indicated by the same reference numerals as those in the first embodiment and explanations thereof will not be provided.

Figure 8A:
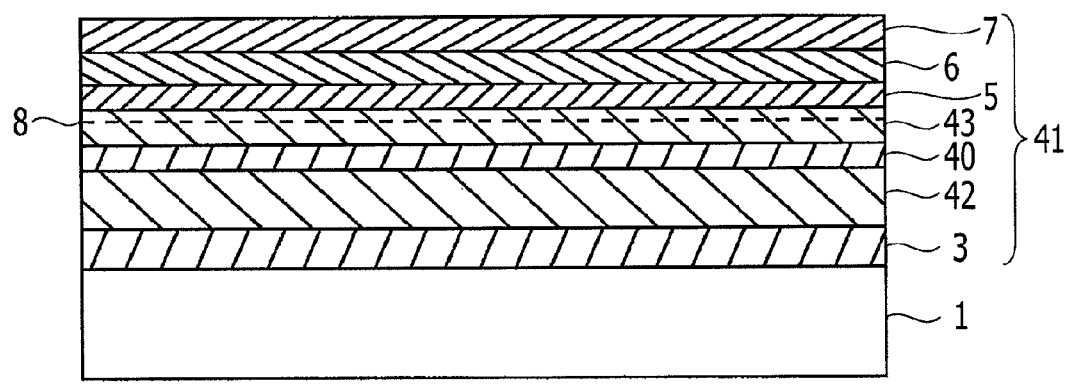
FIGS. 8A to 8I are production step diagrams of a semiconductor device according to a third embodiment.

Initially, as illustrated in FIG. 8A, an epitaxial layer 41 is formed on the surface of a semiconductor substrate 1 by forming a GaN based compound semiconductor and a stopper layer 40 on the surface of the semiconductor substrate 1 through the use of a MOVPE apparatus in an atmosphere under reduced pressure. The semiconductor substrate 1 is, for example, a SiC substrate. However, the semiconductor substrate 1 is not limited to this and may be, for example, a silicon substrate, a sapphire substrate, a MgO substrate, or a ZnO substrate. The thickness of the semiconductor substrate 1 is, for example, about 350 μm.

The epitaxial layer 41 includes a core forming layer 3, a carrier transit layer 42, a stopper layer 40, a carrier transit layer 43, a spacer layer 5, a carrier supply layer 6, and a cap layer 7. The core forming layer 3 is, for example, AlN. The carrier transit layer 42 is, for example, i-GaN. The stopper layer 40 is, for example, AlN. The carrier transit layer 43 is, for example, i-GaN. The spacer layer 5 is, for example, i-AlGaN or i-InAlN. The carrier supply layer 6 is, for example, n-AlGaN or n-InAlN. The cap layer 7 is, for example, n-GaN. The spacer layer 5, the carrier supply layer 6, and the cap layer 7 are examples of compound semiconductor layers. In the carrier transit layer 43, a two-dimensional electron gas 8 is generated in the vicinity of the interface to the spacer layer 5. The epitaxial layer 41 may be a nitride semiconductor layer including the stopper layer 40 and having the same function.

An example of formation of GaN based compound semiconductor and the stopper layer 40 on the semiconductor substrate 1 is described below. Initially, the semiconductor substrate 1 is carried into the MOVPE apparatus; and the semiconductor substrate 1 is heated. A trimethyl aluminum (TMAl) gas and an ammonia (NH$_3$) gas are passed into the MOVPE apparatus, AlN is epitaxially grown on the semiconductor substrate 1 and, thereby, the core forming layer 3 is formed on the semiconductor substrate 1. The film thickness of the core forming layer 3 is, for example, about 300 nm. However, the core forming layer 3 is not necessarily formed; and the formation of the core forming layer 3 may be omitted.

Subsequently, a trimethyl gallium (TMGa) gas and an NH$_3$ gas are passed into the MOVPE apparatus, i-GaN is epitaxially grown on the core forming layer 3 and, thereby, the carrier transit layer 42 is formed on the core forming layer 3. The film thickness of the carrier transit layer 42 is, for example, about 2.5 μm. In this regard, i-GaN is GaN not doped with an impurity intentionally.

A TMAl gas and an NH$_3$ gas are passed into the MOVPE apparatus, AlN is epitaxially grown on the carrier transit layer 42 and, thereby, the stopper layer 40 is formed on the carrier transit layer 42. The film thickness of the stopper layer 40 is, for example, about 5 nm.

A trimethyl gallium (TMGa) gas and an NH$_3$ gas are passed into the MOVPE apparatus, i-GaN is epitaxially grown on the stopper layer 40 and, thereby, the carrier transit layer 43 is formed on the stopper layer 40.

A TMGa gas, a TMAl gas, and an NH$_3$ gas are passed into the MOVPE apparatus, i-Al$_{0.25}$Ga$_{0.75}$N is epitaxially grown on the carrier transit layer 43 and, thereby, the spacer layer 5 is formed on the carrier transit layer 43. The ratio of Al to Ga of i-Al$_{0.25}$Ga$_{0.75}$N may be other values. The film thickness of the spacer layer 5 is, for example, about 5 nm. In this regard, i-AlGaN is AlGaN not doped with an impurity intentionally.

A TMGa gas, a TMAl gas, an NH$_3$ gas, and a silane (SiH$_4$) gas are passed into the MOVPE apparatus. Consequently, n-Al$_{0.25}$Ga$_{0.75}$N is epitaxially grown on the spacer layer 5 and, thereby, the carrier supply layer 6 is formed on the spacer layer 5. The ratio of Al to Ga of n-Al$_{0.25}$Ga$_{0.75}$N may be other values. The film thickness of the carrier supply layer 6 is, for example, about 30 nm. In this regard, n-AlGaN is AlGaN doped with an n-type impurity. For example, Si is used as the n-type impurity and the impurity concentration is about $2 \times 10^{18}$/cm$^3$.

Diffusion of the n-type impurity contained in the carrier supply layer 6 into the carrier transit layer 43 is prevented by the spacer layer 5. Scattering of the carrier in the carrier transit layer 43 by the impurity can be suppressed and, thereby, an increase in output of the device due to an increase in mobility of the carrier can be facilitated. However, in the case where scattering of the carrier in the carrier transit layer 43 does not matter, formation of the spacer layer 5 may be omitted and the carrier supply layer 6 may be formed directly on the carrier transit layer 43.

A TMGa gas, an NH$_3$ gas, and a SiH$_4$ gas are passed into the MOVPE apparatus, n-GaN is epitaxially grown on the carrier supply layer 6 and, thereby, the cap layer 7 is formed on the carrier supply layer 6. The film thickness of the cap layer 7 is, for example, about 6 nm. In this regard, n-GaN is GaN doped with an n-type impurity. For example, Si is used as the n-type impurity and the impurity concentration is about $2 \times 10^{18}$/cm$^3$.

According to the above-described steps, the epitaxial layer 41 is formed on the semiconductor substrate 1 and, thereby, an epitaxial substrate is formed. The epitaxial substrate includes the semiconductor substrate 1 and the epitaxial layer 41.

Figure 8B:
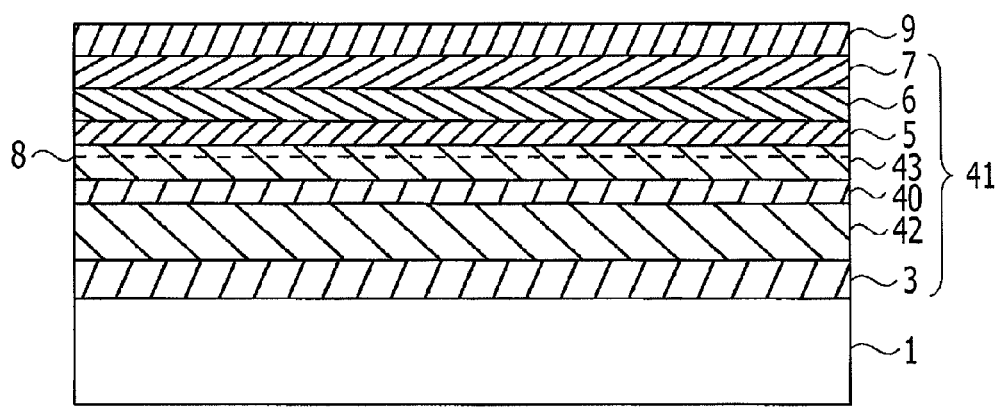

Next, as illustrated in FIG. 8B, a protective film 9 is formed on the cap layer 7 by using a CVD method. The protective film 9 is, for example, SiN. The film thickness of the protective film 9 is, for example, about 500 nm.

A resist is applied to the protective film 9. A photomask is used, ultraviolet rays are applied to a source electrode forming region, and the resist is developed, so that an opening is formed in the resist. The resist provided with the opening is used as a mask; and an opening for the source electrode is formed in the protective film 9 through dry etching by using a fluorine based gas, e.g., CF$_4$ or CF$_6$. Then, the resist provided with the opening is used as a mask, and an opening for the source electrode is formed in the cap layer 7 through dry etching by using an inert gas and a chlorine based gas, e.g., a Cl$_2$ gas.

Figure 8C:
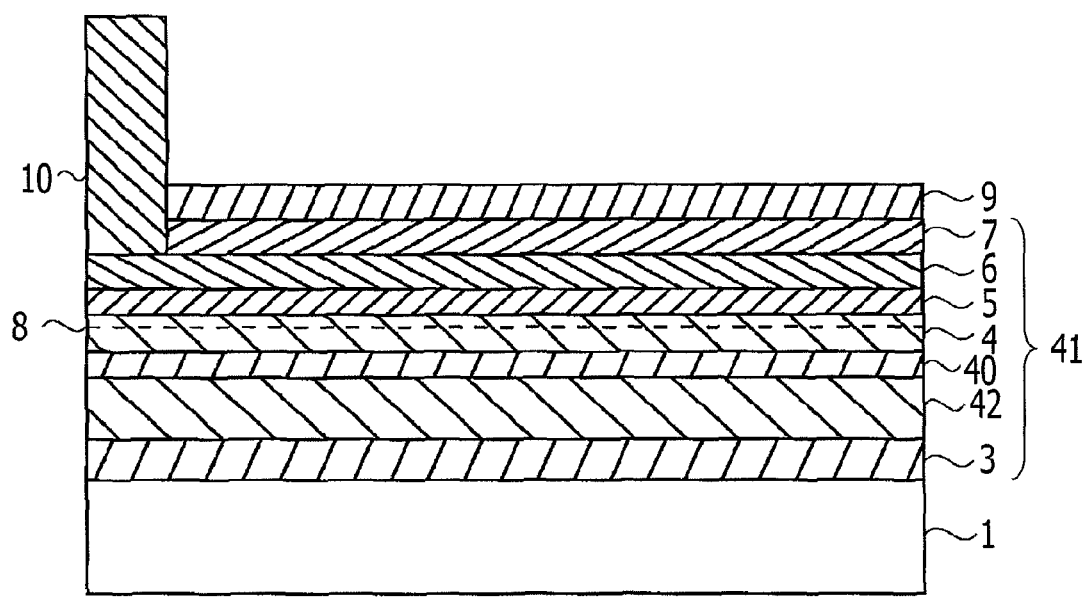

In an atmosphere under reduced pressure, Ta and Al are formed in the opening for the source electrode by the evaporation method. The film thickness of Ta is, for example, about 20 nm, and the film thickness of Al is, for example, about 200 nm. Subsequently, as illustrated in FIG. 8C, the resist is removed (lifted off) and, thereby, a source electrode 10 is formed on the carrier supply layer 6. The example in which the source electrode 10 is formed on the carrier supply layer 6 has been explained, but the source electrode 10 may be formed on the cap layer 7 without removing a part of the cap layer 7.

A resist is applied to the protective film 9. A photomask is used, ultraviolet rays are applied to a gate electrode forming region, and the resist is developed, so that an opening is formed in the resist. The resist provided with the opening is used as a mask; and an opening for the gate electrode is formed in the protective film 9 through dry etching by using a fluorine based gas, e.g., CF$_4$ or CF$_6$.

Figure 8D:
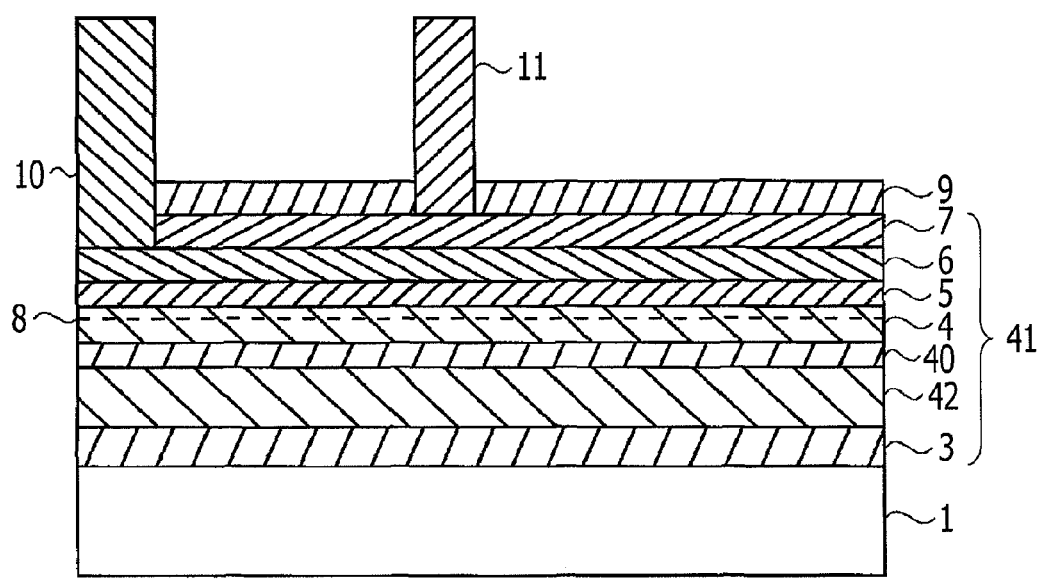

In an atmosphere under reduced pressure, Ti and Au are formed in the opening for the gate electrode by the evaporation method. The film thickness of Ti is, for example, about 10 nm, and the film thickness of Au is, for example, about 200 nm. Subsequently, as illustrated in FIG. 8D, the resist is removed (lifted off) and, thereby, a gate electrode 11 is formed on the cap layer 7. Here, Ti and Au are used as the materials for the gate metals, but metals other than Ti and Au may be used as the materials for the gate electrode 11.

The semiconductor substrate 1 is turned upside down, and a resist is applied to the back of the semiconductor substrate 1. A photomask is used, and ultraviolet rays are applied to a drain electrode forming region and a current inhibition groove forming region, so that an opening for drain electrode forming groove and an opening for current inhibition groove are formed in the resist.

Figure 8E:
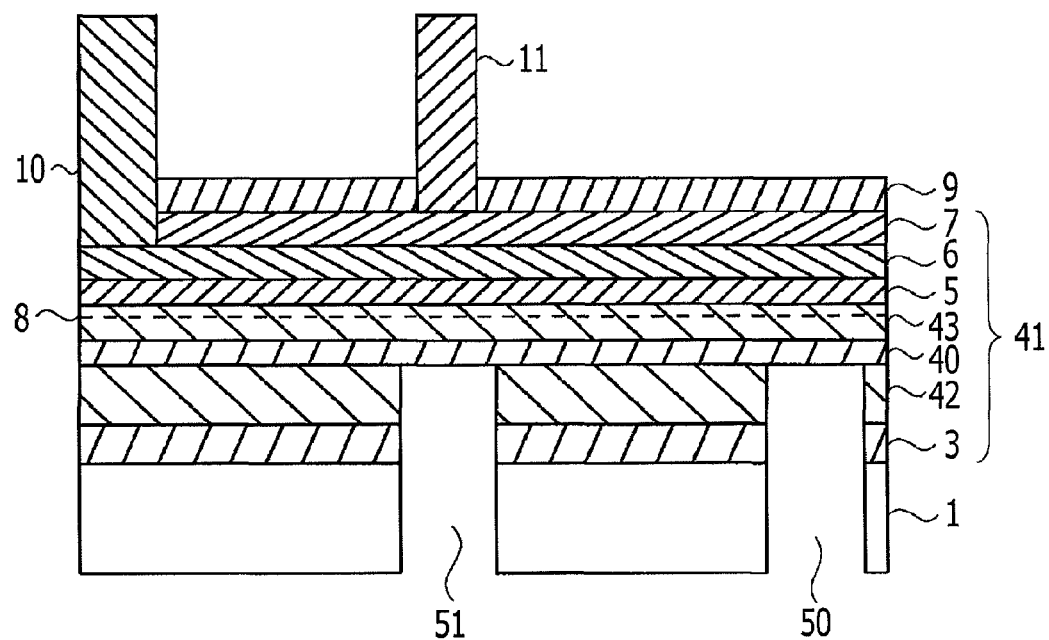

The resist formed on the back of the semiconductor substrate 1 is used as a mask, dry etching is performed by using an inert gas and a chlorine based gas, e.g., a $Cl_2$ gas. As illustrated in FIG. 8E, by performing the dry etching, a drain electrode forming groove 50 and a current inhibition groove 51 are formed in the semiconductor substrate 1, the core forming layer 3, and the carrier transit layer 42. The drain electrode forming groove 50 is an example of a third groove. The current inhibition groove 51 is an example of a fourth groove. With regard to the dry etching at this time, for example, the antenna power is specified to be about 200 W, and the bias power is specified to be about 30 W. The diameter of the current inhibition groove 51 is preferably 10 nm or more, and 10 µm or less. In FIG. 8E, the resist formed on the back of the semiconductor substrate 1 is not illustrated.

The drain electrode forming groove 50 is a groove formed in a region in which a drain electrode is disposed. The drain electrode forming groove 50 is formed up to the inside of the carrier transit layer 42 while penetrating the semiconductor substrate 1 and the core forming layer 3 and reaches the stopper layer 40. That is, the drain electrode forming groove 50 penetrates the semiconductor substrate 1 and the core forming layer 3 and is terminated at the interface between the stopper layer 40 and the carrier transit layer 42.

The current inhibition groove 51 is a groove to prevent a current from passing under a depletion layer generated just below the gate electrode 11. The current inhibition groove 51 is formed up to the inside of the carrier transit layer 42 while penetrating the semiconductor substrate 1 and the core forming layer 3 and is terminated at the interface between the stopper layer 40 and the carrier transit layer 42.

When the stopper layer 40 is subjected to dry etching, the color of plasma changes. The dry etching can be terminated at the interface between the stopper layer 40 and the carrier transit layer 42 by terminating the dry etching on the basis of a change in color of plasma as a guide. For example, even in the case where the etching rate of the dry etching for forming the drain electrode forming groove 50 and the current inhibition groove 51 is large, the dry etching can be stably terminated at the interface between the stopper layer 40 and the carrier transit layer 42.

In the example illustrated in FIG. 8E, the current inhibition groove 51 is formed at the position just below the gate electrode 11, although not limited to this. The position of formation of the current inhibition groove 51 may be changed. For example, The current inhibition groove 51 may be formed in the vicinity of the position just below the gate electrode 11.

Figure 8F:
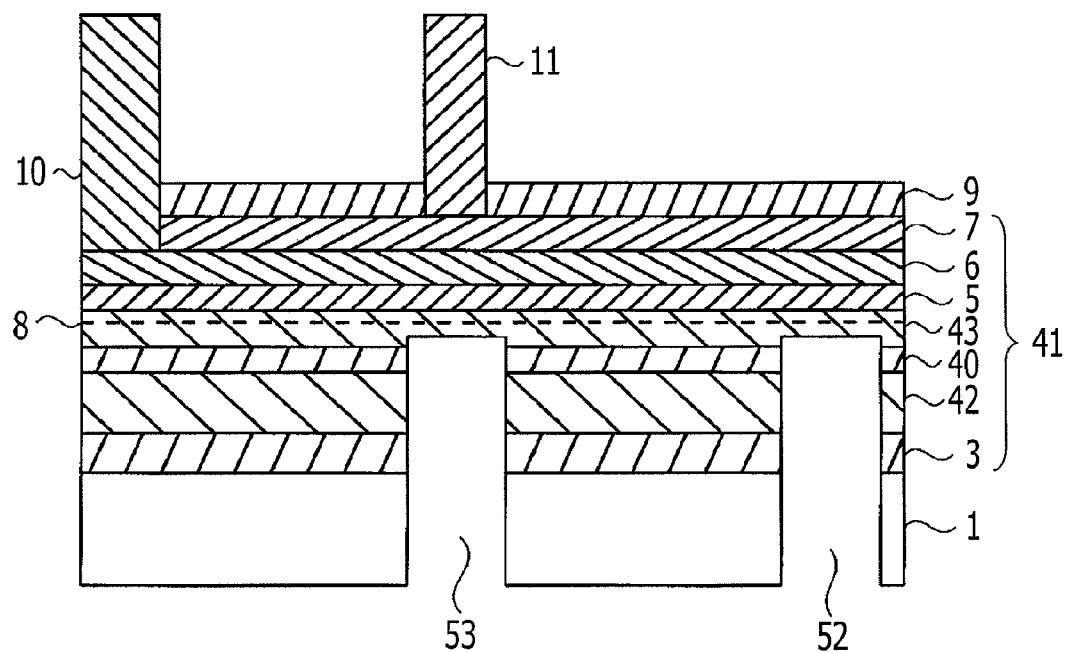

The resist formed on the back of the semiconductor substrate 1 is used as a mask, and dry etching is performed by using an inert gas and a chlorine based gas, e.g., a $Cl_2$ gas. By performing the dry etching, the drain electrode forming groove 50 and the current inhibition groove 51 are further dug. As illustrated in FIG. 8F, by further digging the drain electrode forming groove 50 and the current inhibition groove 51, the drain electrode forming groove 52 and the current inhibition groove 53 are formed in the semiconductor substrate 1, the core forming layer 3, the carrier transit layer 42, the stopper layer 40, and the carrier transit layer 43. The drain electrode forming groove 52 is an example of the first groove. The current inhibition groove 53 is an example of the second groove. Regarding the dry etching at this time, for example, the antenna power is specified to be about 100 W, and the bias power is specified to be about 10 W. The diameter of the current inhibition groove 52 is preferably 10 nm or more, and 10 µm or less.

For example, regarding the dry etching for forming the drain electrode forming groove 52 and the current inhibition groove 53, the etching rate may be reduced by reducing the etching power, or the etching rate may be reduced by changing the gas species. In the case where the etching rate of the dry etching for forming the drain electrode forming groove 52 and the current inhibition groove 53 is reduced, high precision etching can be performed.

The resist disposed on the back of the semiconductor substrate 1 is removed. Thereafter, a fresh resist is applied to the back of the semiconductor substrate 1. A photomask is used, and ultraviolet rays are applied to a drain electrode forming region, so that an opening for drain electrode is formed in the resist.

Figure 8G:
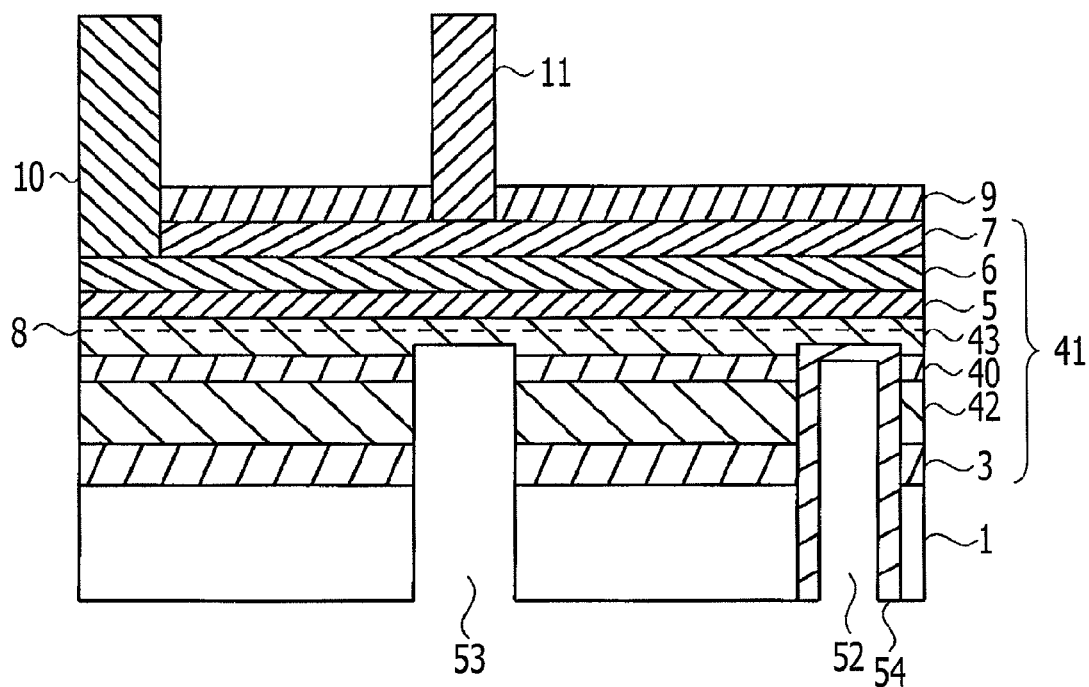

In an atmosphere under reduced pressure, Ti and Al are formed in the drain electrode forming groove 52 by the evaporation method. The film thickness of Ti is, for example, about 10 nm, and the film thickness of Al is, for example, about 200 nm. Subsequently, as illustrated in FIG. 8G, the resist disposed on the back of the semiconductor substrate 1 is removed (lifted off) and, thereby, a drain electrode 54 is formed in the drain electrode forming groove 52. That is, the drain electrode 54 is formed in the inside of the semiconductor substrate 1, in the inside of the core forming layer 3, in the inside of the carrier transit layer 42, in the inside of the stopper layer 40, and in the inside of the carrier transit layer 43. The drain electrode 54 may be flattened by the CMP method, as needed.

Then, a heat treatment is performed in a nitrogen atmosphere at 400° C. or higher, and 1,000° C. or lower (for example, about 600° C.), so that ohmic characteristics of the source electrode 10 and the drain electrode 54 are established.

The carrier transit layer 43 in the vicinity or the periphery of the drain electrode 54 forming region may be doped with Si ions and an activation annealing treatment may be performed. Consequently, even when the drain electrode 54 is formed in the inside of the carrier transit layer 43, ohmic contact is easily ensured. If the activation annealing treatment is performed after the source electrode 10 is formed, the source electrode 10 may be broken. Therefore, it is preferable that the doping of the carrier transit layer 43 with Si ions and the activation annealing treatment are performed after formation of the carrier transit layer 43 and before formation of the source electrode 10.

The semiconductor device illustrated in FIG. 8G includes the semiconductor substrate 1, the epitaxial layer 41, the protective film 9, the source electrode 10, the gate electrode 11, the drain electrode forming groove 52, the current inhibition groove 53, and the drain electrode 54. The gate electrode 11 is located between the source electrode 10 formed on the carrier supply layer 6 and the drain electrode forming groove 52 formed from the back of the semiconductor substrate 1 toward the inside of the semiconductor substrate 1 and is formed on the cap layer 7. The current inhibition groove 53 is located diagonally under the source electrode 10 and between the source electrode 10 and the drain electrode forming groove 52 and is formed from the back of the semiconductor substrate 1 up to the inside of the carrier transit layer 43 while penetrating the semiconductor substrate 1. The drain electrode forming groove 52 is located diagonally under the gate electrode 11 formed on the cap layer 7 and in the direction opposite to the direction of formation of the source electrode 10.

Figure 8H:
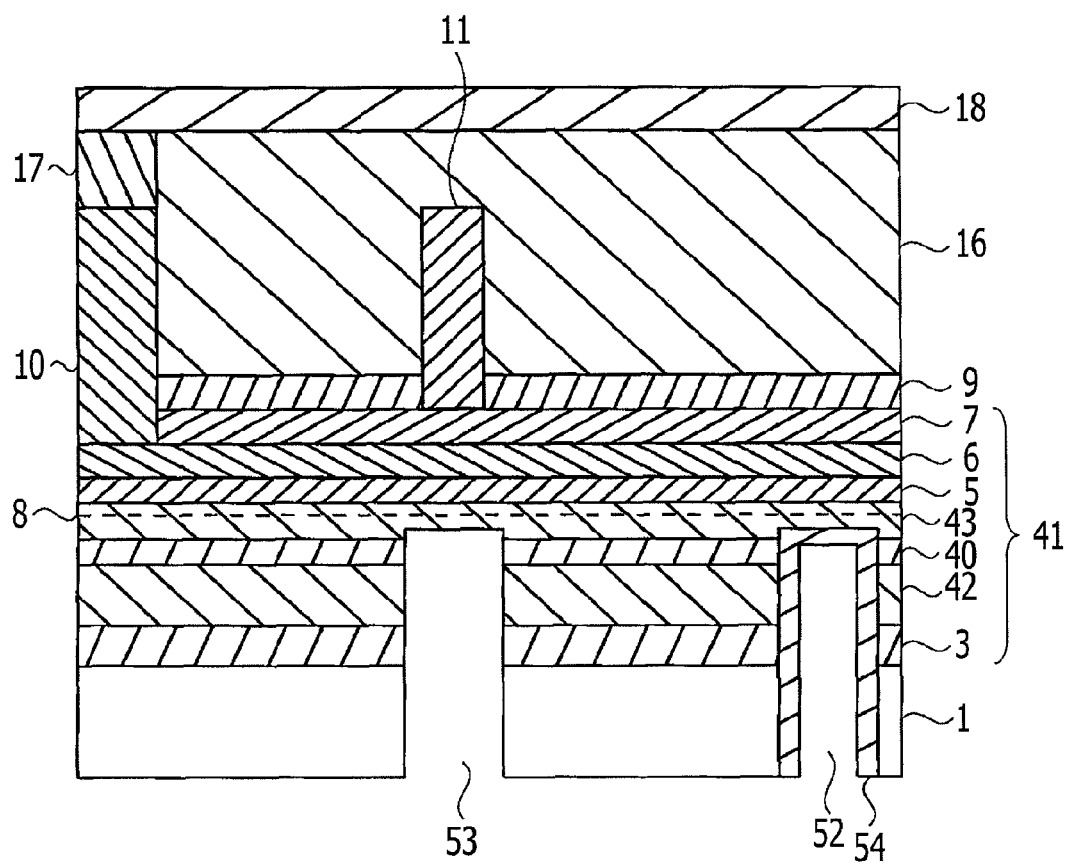

The interlayer insulating film 16 is formed on the surface side of the semiconductor substrate 1 by using the CVD method, while the surface side of the semiconductor substrate 1 is faced upward. The interlayer insulating film 16 is, for example, $SiO_2$. The interlayer insulating film 16 is flattened by the CMP method. A contact hole is formed in the interlayer insulating film 16 through photolithography and etching. For example, W is deposited on the interlayer insulating film 16 and, thereafter, W is polished by the CMP method, so that a contact 17 is formed in the contact hole. As illustrated in FIG. 8H, a metal, e.g., Al or Cu, is deposited on the interlayer insulating film 16, and a wiring 18 connected to the source electrode 10 is formed on the interlayer insulating film 16 through photolithography and etching. A wiring connected to the gate electrode 11 is also formed in a manner similar to that of the wiring 18, although the wiring connected to the gate electrode 11 is not illustrated in the drawing.

The semiconductor substrate 1 is turned upside down; and a resist is applied to the back of the semiconductor substrate 1. A photomask is used, and ultraviolet rays are applied to the current inhibition groove 53 forming region, so that an opening is formed in the resist above the current inhibition groove 53.

Figure 8I:
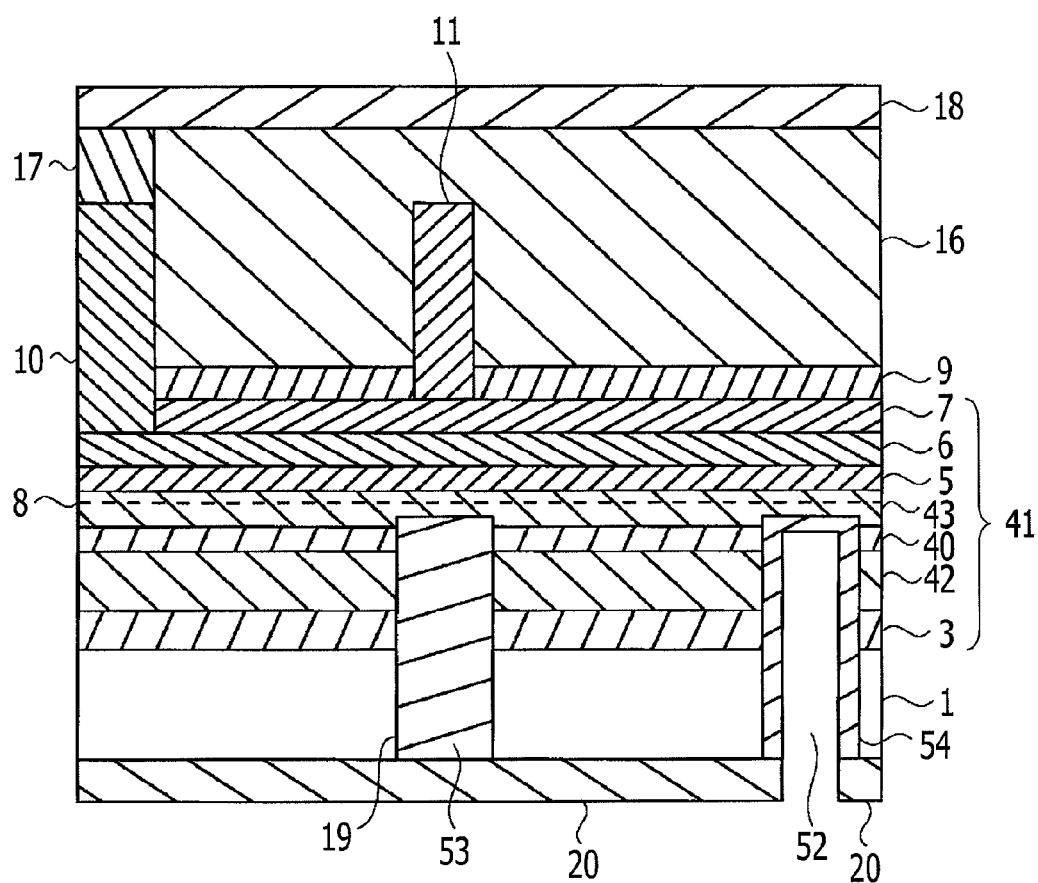

Then, SiN is formed through embedding into the current inhibition groove 53 by using the CVD method, and the resist is removed (lifted off), so that the current inhibition film 19 is formed in the current inhibition groove 53. As illustrated in FIG. 8I, a metal, e.g., Al or Cu, is deposited on the back of the semiconductor substrate 1, and the wiring 20 connected to the drain electrode 54 is formed on the back of the semiconductor substrate 1 through photolithography and etching. The wiring 18 is formed on the surface side of the semiconductor substrate 1 and the wiring 20 is formed on the back side of the semiconductor substrate 1. Therefore, the flexibility in wiring is increased; and the chip area can be reduced.

If the wiring 20 is formed in the current inhibition groove 53, the distance between the gate electrode 11 and the wiring 20 is reduced, so that the breakdown voltage is reduced. Therefore, the current inhibition film 19 is formed in the current inhibition groove 53. The current inhibition film 19 formed in the current inhibition groove 53 prevents a current from passing under the depletion layer generated just below the gate electrode 11.

Regarding the semiconductor device according to the third embodiment, the drain electrode 54 is disposed on the back side of the semiconductor substrate 1 and, thereby, a high electric field is applied to a range diagonally under the gate electrode 11, so that application of a high electric field to the protective film 9 and the interlayer insulating film 16 can be suppressed. As a result, the dielectric breakdown voltage of the semiconductor device can be improved.

Figure 9:
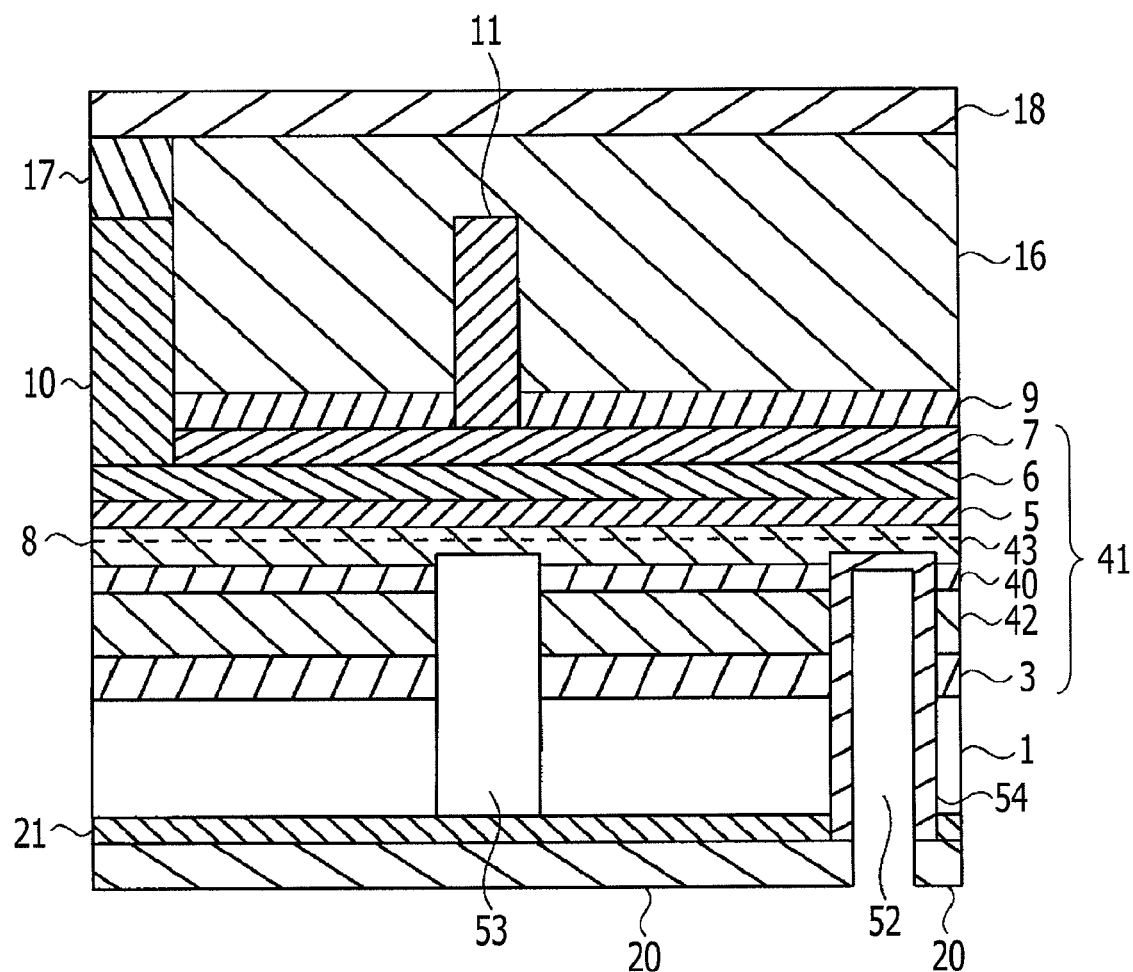
FIG. 9 is a sectional view of the semiconductor device according to the third embodiment in the case where the inside of a current inhibition groove is a space.

The inside of the current inhibition groove 53 may be a space without forming the current inhibition film 19 in the current inhibition groove 53, as in the first embodiment. FIG. 9 is a sectional view of a semiconductor device in the case where the inside of the current inhibition groove 53 is a space. The semiconductor device illustrated in FIG. 9 includes a silicon carbide film 21, which has low step coverage ability relative to the base material, between the semiconductor substrate 1 and the wiring.

In the semiconductor device illustrated in FIG. 9, the inside of the current inhibition groove 53 is a space, and the inlet of the current inhibition groove 53 is covered with the silicon carbide film 21. The silicon carbide film 21 is, for example, SiC or SiOC. The silicon carbide film 21 having low step coverage ability is used and, therefore, the inlet of the current inhibition groove 53 is closed by the silicon carbide film 21 before the space in the current inhibition groove 53 is filled with the silicon carbide film 21. Formation of the silicon carbide film 21 may be performed in the step before the drain electrode 54 is formed or be performed in the step after the drain electrode 54 is formed.

In the above description, the drain electrode forming groove 52 and the current inhibition groove 53 are formed having the same level of depths. However, the drain electrode forming groove 52 may be formed more deeply than is the current inhibition groove 53. Subsequently, the drain electrode 54 may be formed in the inside of the deeply formed drain electrode forming groove 52.

Figure 10:
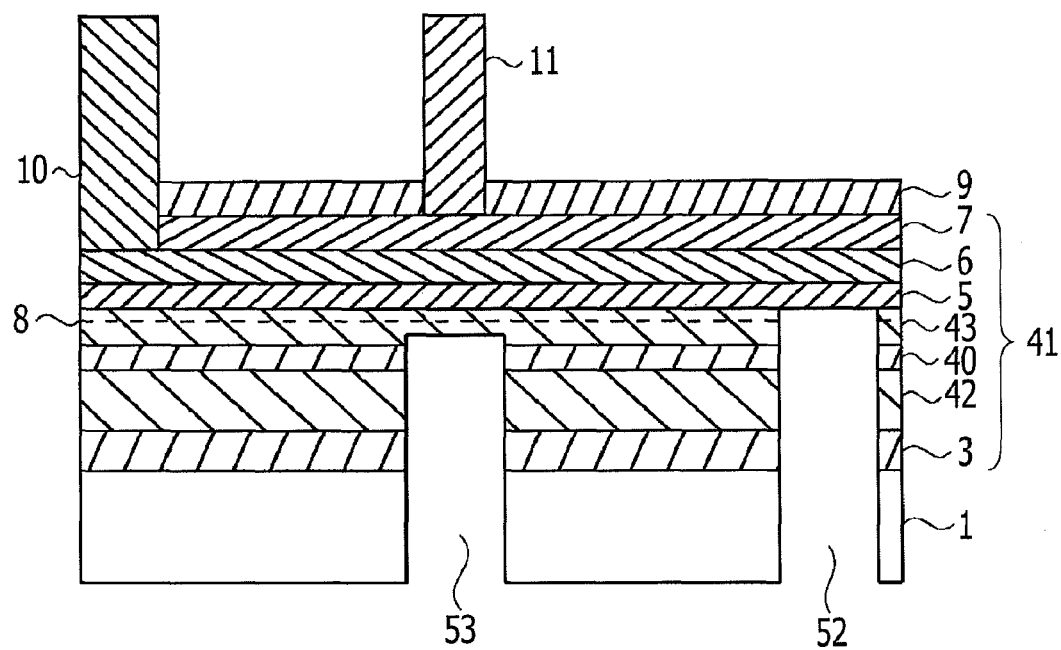
FIG. 10 is a sectional view of the semiconductor device according to the third embodiment in the case where a drain electrode forming groove is formed more deeply than is the current inhibition groove.

For example, after the step explained with reference to FIG. 8F is performed, a resist is applied to the back of the semiconductor substrate 1. A photomask is used, and ultraviolet rays are applied to the drain electrode 54 forming region, so that an opening is formed in the resist. The drain electrode 54 forming region is subjected to an additional etching step to further dig the drain electrode forming groove 52. As illustrated in FIG. 10, the drain electrode forming groove 52 is formed more deeply than is the current inhibition groove 53 by further digging the drain electrode forming groove 52. For example, the drain electrode forming groove 52 may penetrate the semiconductor substrate 1, the core forming layer 3, the carrier transit layer 42, and the stopper layer 40 and be terminated at the interface or in the vicinity of the interface between the spacer layer 5 and the carrier transit layer 43. Alternatively, the drain electrode forming groove 52 may penetrate the semiconductor substrate 1, the core forming layer 3, the carrier transit layer 42, the stopper layer 40, and the carrier transit layer 43 and be terminated in the inside of the spacer layer 5.

Figure 11:
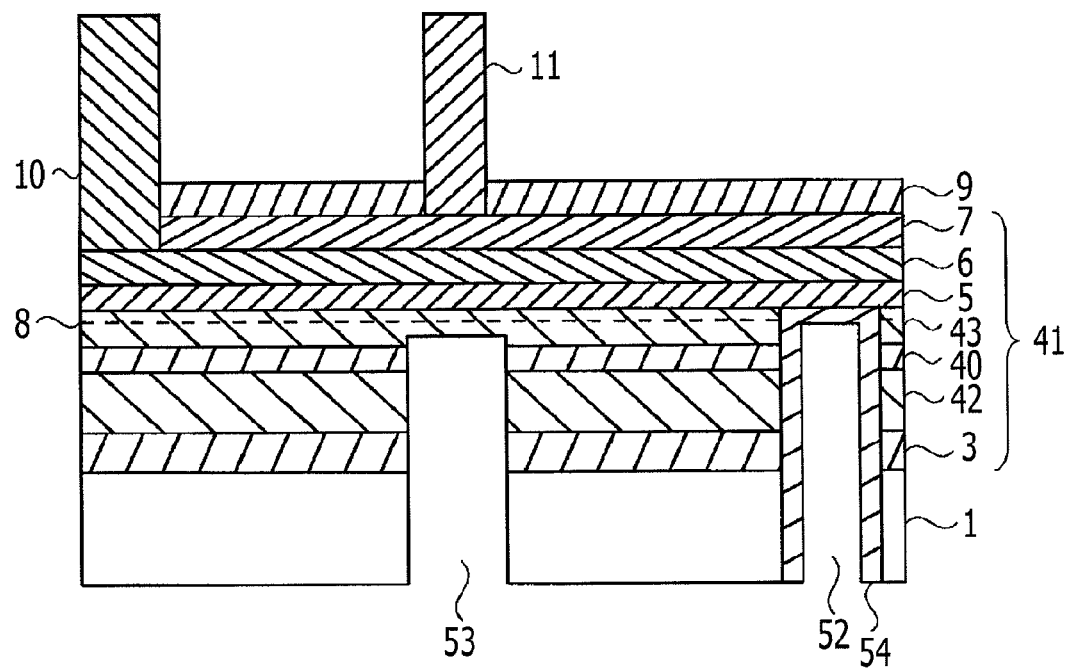
FIG. 11 is a sectional view of the semiconductor device according to the third embodiment in the case where a drain electrode is disposed in the deeply disposed drain electrode forming groove.

In the case where the drain electrode 54 is formed in the inside of the deeply formed drain electrode forming groove 52, the same step as the step explained with reference to FIG. 8G is performed. That is, in an atmosphere under reduced pressure, Ti and Al are formed in the deeply formed drain electrode forming groove 52 by the evaporation method. The film thickness of Ti is, for example, about 10 nm, and the film thickness of Al is, for example, about 200 nm. Subsequently, as illustrated in FIG. 11, the resist disposed on the back of the semiconductor substrate 1 is removed (lifted off) and, thereby, a drain electrode 54 is formed in the deeply formed drain electrode forming groove 52.

In the case where the drain electrode forming groove 52 is terminated at the interface between the spacer layer 5 and the carrier transit layer 43, the drain electrode 54 is formed up to the interface between the spacer layer 5 and the carrier transit layer 43. In the case where the drain electrode forming groove 52 is terminated at the vicinity of the interface between the spacer layer 5 and the carrier transit layer 43, the drain electrode 54 is formed up to the vicinity of the interface between the spacer layer 5 and the carrier transit layer 43. In the case where the drain electrode forming groove 52 penetrates the semiconductor substrate 1, the core forming layer 3, the carrier transit layer 42, the stopper layer 40, and the carrier transit layer 43 and is terminated in the inside of the spacer layer 5, the drain electrode 54 is formed up to the inside of the spacer layer 5.

The positions of formation of the current inhibition grooves 51 and 53 may be changed as described below. For example, the current inhibition grooves 51 and 53 may be formed between the position just below the gate electrode 11 and the position, at which the drain electrode 54 is disposed. In the case where the current inhibition grooves 51 and 53 are formed between the position just below the gate electrode 11 and the position, at which the drain electrode 54 is disposed, a current is prevented from passing into the drain electrode 54 when the transistor is off, as in the case where the current inhibition grooves 51 and 53 are formed at the positions just below the gate electrode 11.

Alternatively, the positions of formation of the current inhibition grooves 51 and 53 can be brought close to the direction of the position just below the source electrode 10. However, if the distance between the depletion layer generated just below the gate electrode 11 and the current inhibition groove 53 is too large, a current may pass between the depletion layer generated just below the gate electrode 11 and the current inhibition groove 53. Therefore, in the case where the positions of formation of the current inhibition grooves 51 and 53 are brought close to the direction of the position just below the source electrode 10, it is preferable that the current inhibition grooves 51 and 53 are formed at the positions adjacent to the position just below the gate electrode 11.

A semiconductor device according to a fourth embodiment and a method for manufacturing the same will hereinafter be described. The fourth embodiment is explained in reference to a semiconductor device having a GaN based HEMT structure. In this regard, the same constituents as those in the first embodiment are indicated by the same reference numerals as those in the first embodiment and explanations thereof will not be provided.

With regard to the method for manufacturing the semiconductor device according to the fourth embodiment, in the initial stage, the same steps as the steps explained in reference to FIGS. 1A to 1E in the first embodiment are performed, although explanations thereof are omitted. Therefore, regarding the method for manufacturing the semiconductor device according to the fourth embodiment, explanations are started from the step after the steps explained with reference to FIGS. 1A to 1E in the first embodiment are performed.

Figure 12A:
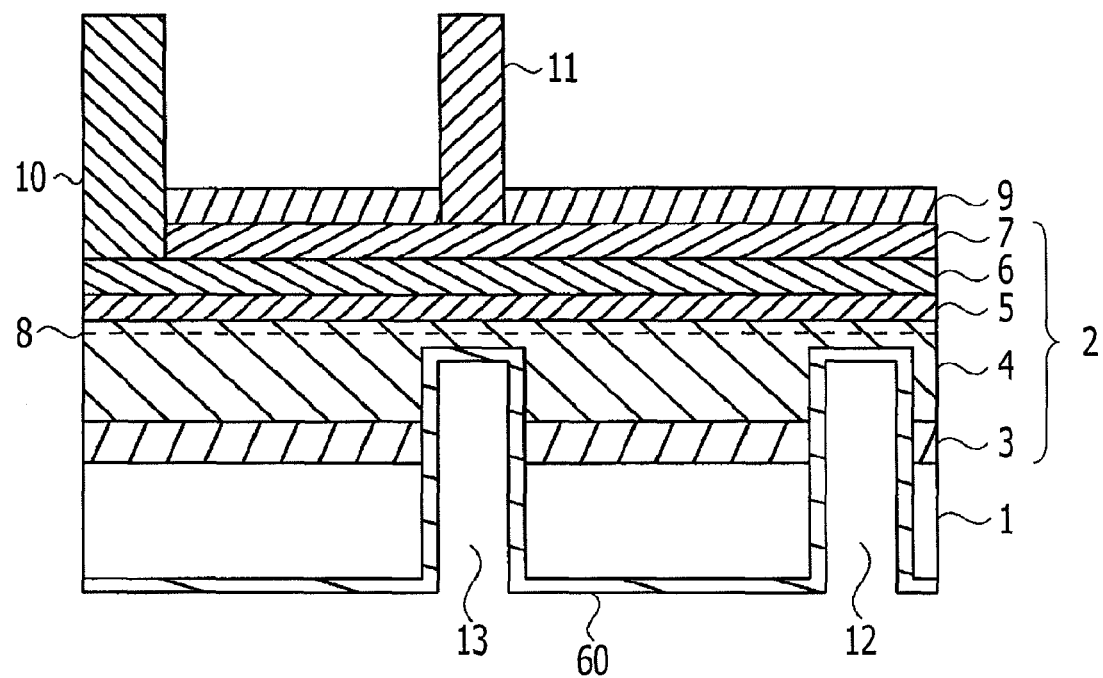
FIGS. 12A to 12E are production step diagrams of a semiconductor device according to a fourth embodiment.

After the same steps as the steps explained in reference to FIGS. 1A to 1E in the first embodiment are performed, the resist disposed on the back of the semiconductor substrate 1 is removed. As illustrated in FIG. 12A, SiN is deposited on the back side of the semiconductor substrate 1 by using the CVD method and, thereby, the protective film 60 is formed on the back of the semiconductor substrate 1, the side wall and the bottom of the drain electrode forming groove 12, and the side wall and the bottom of the current inhibition groove 13. The back of the semiconductor substrate 1 is protected by formation of the protective film 60 on the back of the semiconductor substrate 1.

Figure 12B:
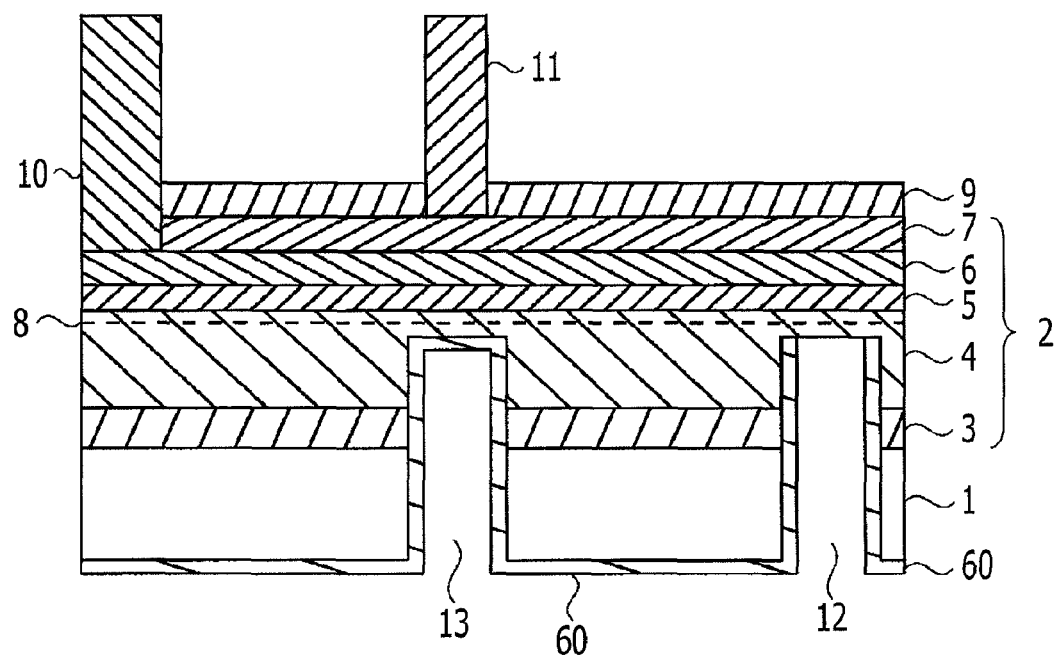

A resist is applied to the back of the semiconductor substrate 1. A photomask is used, and ultraviolet rays are applied to a drain electrode forming region, so that an opening for drain electrode is formed in the resist. The resist provided with the opening for drain electrode is used as a mask and, as illustrated in FIG. 12B, the protective film 60 disposed on the drain electrode forming groove 12 is removed through dry etching by using an inert gas and a chlorine based gas, e.g., a $Cl_2$ gas. In FIG. 12B, the resist formed on the back of the semiconductor substrate 1 is not illustrated.

The resist disposed on the back of the semiconductor substrate 1 is removed. Thereafter, a fresh resist is applied to the back of the semiconductor substrate 1. A photomask is used, and ultraviolet rays are applied to a drain electrode forming region, so that an opening for drain electrode is formed in the resist.

Figure 12C:
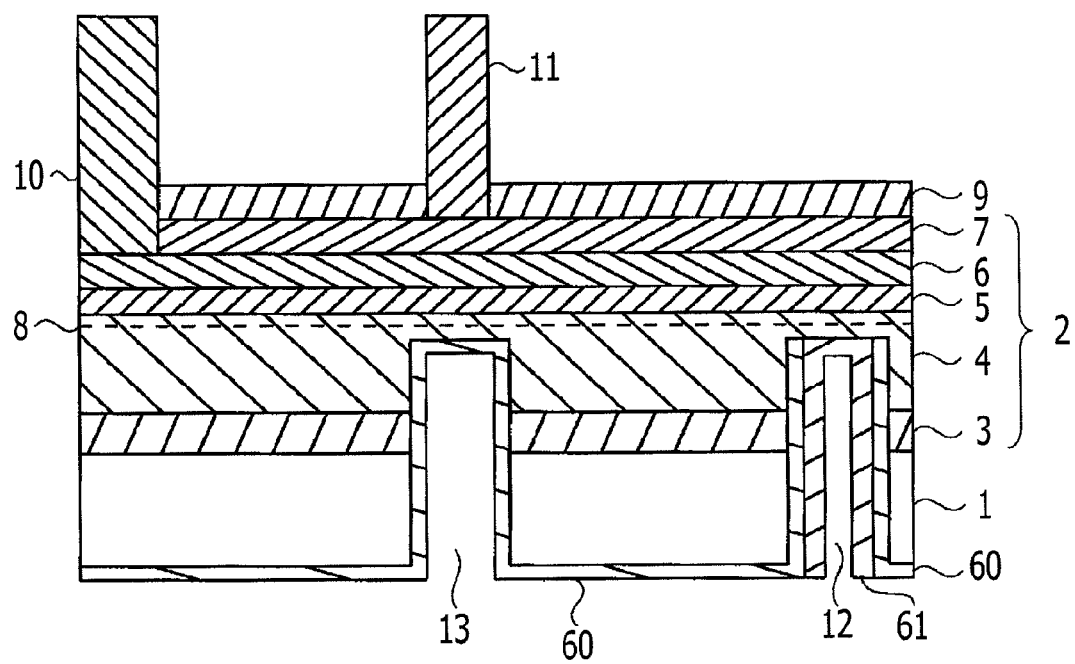

In an atmosphere under reduced pressure, Ti and Al are formed in the drain electrode forming groove 12 by the evaporation method. The film thickness of Ti is, for example, about 10 nm, and the film thickness of Al is, for example, about 200 nm. Subsequently, as illustrated in FIG. 12C, the resist is removed (lifted off) and, thereby, a drain electrode 61 is formed in the drain electrode forming groove 12. That is, the drain electrode 61 is formed in the inside of the semiconductor substrate 1, in the inside of the core forming layer 3, and in the inside of the carrier transit layer 4. The drain electrode 61 may be flattened by the CMP method, as needed.

As illustrated in FIG. 12C, the protective film 60, serving as an insulating film, is disposed on the side surface of the drain electrode 61. Consequently, a current is prevented from passing into the drain electrode 61 from portions other than the two-dimensional electron gas 8 of the carrier transit layer 4. A current can be prevented from passing into the drain electrode 61 more reliably.

Then, a heat treatment is performed in a nitrogen atmosphere at 400° C. or higher, and 1,000° C. or lower (for example, about 600° C.), so that ohmic characteristics of the source electrode 10 and the drain electrode 61 are established.

The carrier transit layer 4 in the vicinity or the periphery of the drain electrode 61 forming region may be doped with Si ions and an activation annealing treatment may be performed. Consequently, even when the drain electrode 61 is formed in the inside of the carrier transit layer 4, ohmic contact is easily ensured. If the activation annealing treatment is performed after the source electrode 10 is formed, the source electrode 10 may be broken. Therefore, it is preferable that the doping of the carrier transit layer 4 with Si ions and the activation annealing treatment are performed after formation of the carrier transit layer 4 and before formation of the source electrode 10.

The semiconductor device illustrated in FIG. 12C includes the semiconductor substrate 1, the epitaxial layer 2, the protective film 9, the source electrode 10, the gate electrode 11, the drain electrode forming groove 12, the current inhibition groove 13, and the drain electrode 61. The gate electrode 11 is located between the source electrode 10 formed on the carrier supply layer 6 and the drain electrode forming groove 12 formed from the back of the semiconductor substrate 1 toward the inside of the semiconductor substrate 1 and is formed on the cap layer 7. The current inhibition groove 13 is located diagonally under the source electrode 10 and between the source electrode 10 and the drain electrode forming groove 12 and is formed from the back of the semiconductor substrate 1 up to the inside of the carrier transit layer 4 while penetrating the semiconductor substrate 1. The drain electrode forming groove 12 is located diagonally under the gate electrode 11 formed on the cap layer 7 and in the direction opposite to the direction of formation of the source electrode 10.

Figure 12D:
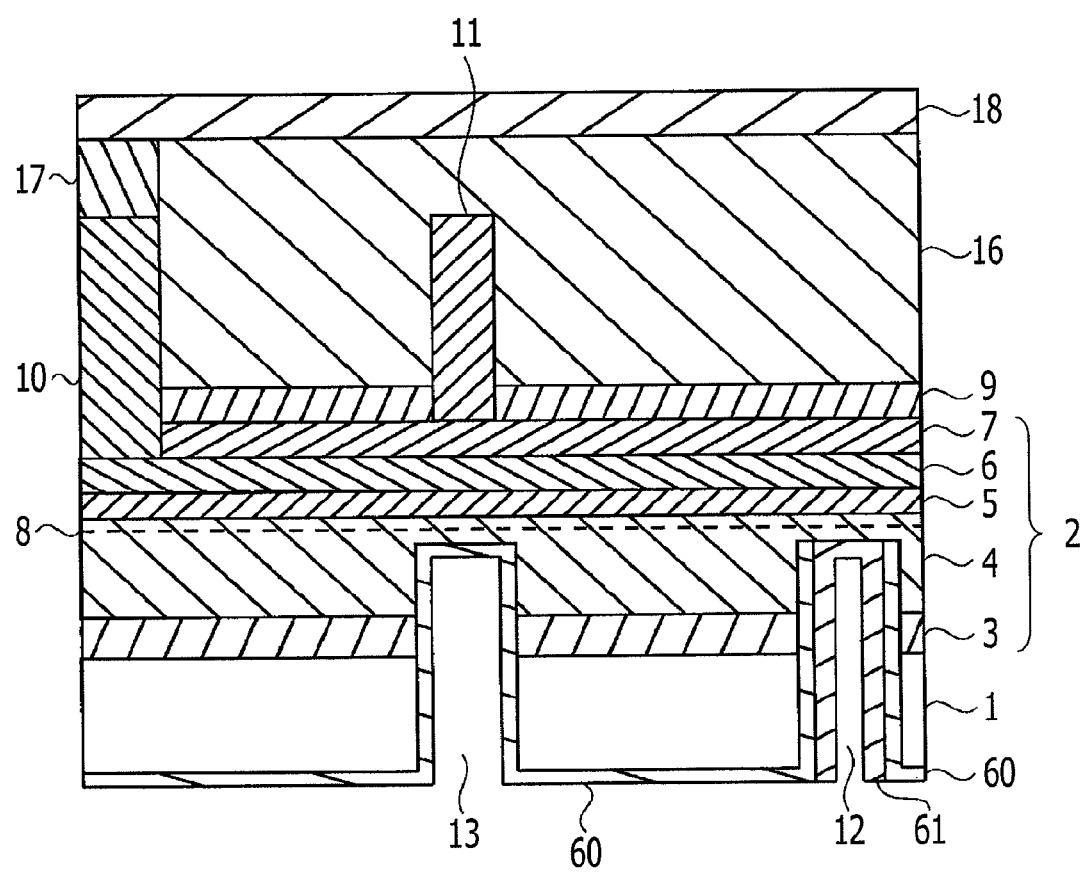

The interlayer insulating film 16 is formed on the surface side of the semiconductor substrate 1 by using the CVD method while the surface side of the semiconductor substrate 1 is faced upward. The interlayer insulating film 16 is, for example, $SiO_2$. The interlayer insulating film 16 is flattened by the CMP method. A contact hole is formed in the interlayer insulating film 16 through photolithography and etching. For example, W is deposited on the interlayer insulating film 16 and, thereafter, W is polished by the CMP method, so that a contact 17 is formed in the contact hole. As illustrated in FIG. 12D, a metal, e.g., Al or Cu, is deposited on the interlayer insulating film 16, and a wiring 18 connected to the source electrode 10 is formed on the interlayer insulating film 16 through photolithography and etching. A wiring connected to the gate electrode 11 is also formed in a manner similar to that of the wiring 18, although the wiring connected to the gate electrode 11 is not illustrated in the drawing.

The semiconductor substrate 1 is turned upside down, and a resist is applied to the back of the semiconductor substrate 1. A photomask is used, and ultraviolet rays are applied to the current inhibition groove 13 forming region, so that an opening is formed in the resist above the current inhibition groove 13.

Figure 12E:
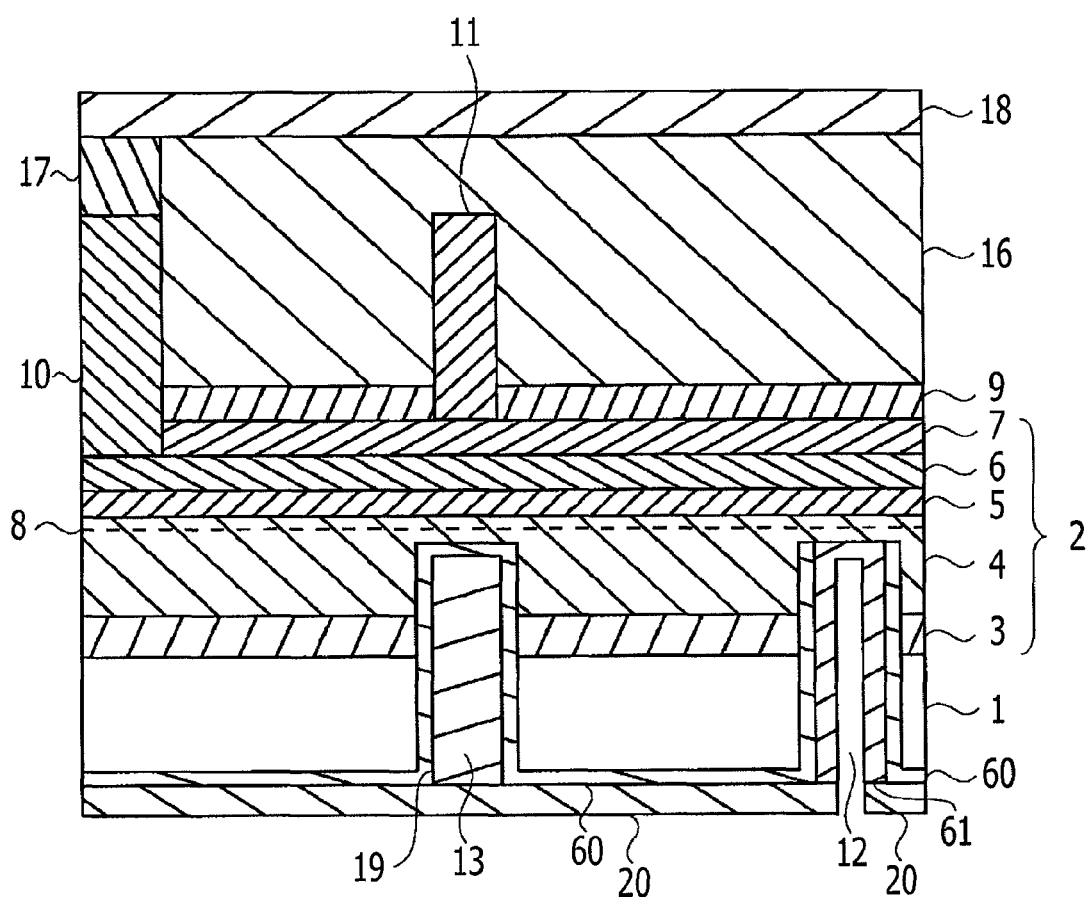

Then, SiN is formed through embedding into the current inhibition groove 13 by using the CVD method, and the resist is removed (lifted off), so that the current inhibition film 19 is formed in the current inhibition groove 13. As illustrated in FIG. 12E, a metal, e.g., Al or Cu, is deposited on the back of the semiconductor substrate 1, and the wiring 20 connected to the drain electrode 61 is formed on the back of the semiconductor substrate 1 through photolithography and etching. The wiring 18 is formed on the surface side of the semiconductor substrate 1 and the wiring 20 is formed on the back side of the semiconductor substrate 1. Therefore, the flexibility in wiring is increased and the chip area can be reduced.

If the wiring 20 is formed in the current inhibition groove 13, the distance between the gate electrode 11 and the wiring 20 is reduced, so that the breakdown voltage is reduced. Therefore, the current inhibition film 19 is formed in the current inhibition groove 13. The current inhibition film 19 formed in the current inhibition groove 13 prevents a current from passing under the depletion layer generated just below the gate electrode 11.

With regard to the semiconductor device according to the fourth embodiment, the drain electrode 61 is disposed on the back side of the semiconductor substrate 1 and, thereby, a high electric field is applied to a range diagonally under the gate electrode 11, so that application of a high electric field to the protective film 9 and the interlayer insulating film 16 can be suppressed. As a result, the dielectric breakdown voltage of the semiconductor device can be improved.

Figure 13:
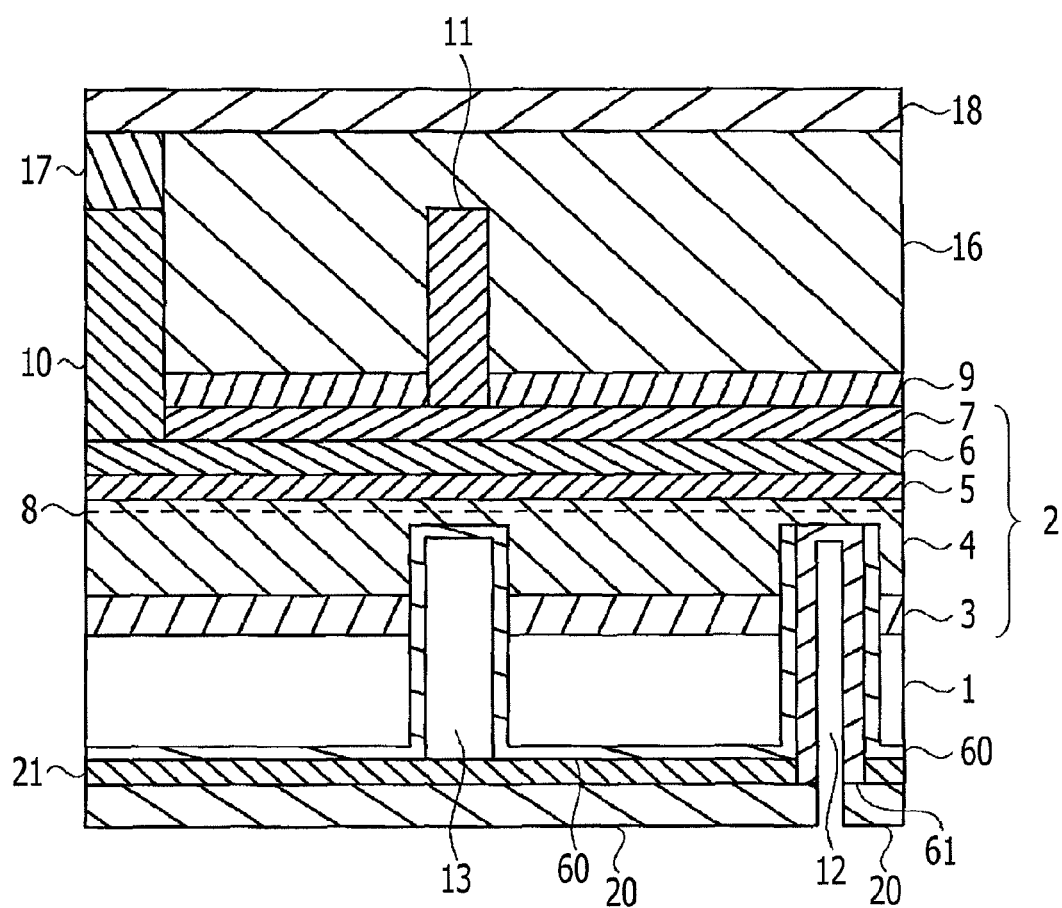
FIG. 13 is a sectional view of the semiconductor device according to the fourth embodiment in the case where the inside of a current inhibition groove is a space.

The inside of the current inhibition groove 13 may be a space without forming the current inhibition film 19 in the current inhibition groove 13, as in the first embodiment. FIG. 13 is a sectional view of a semiconductor device in the case where the inside of the current inhibition groove 13 is a space. The semiconductor device illustrated in FIG. 13 includes a silicon carbide film 21, which has low step coverage ability relative to the base material, between the semiconductor substrate 1 and the wiring.

In the semiconductor device illustrated in FIG. 13, the inside of the current inhibition groove 13 is a space; and the inlet of the current inhibition groove 13 is covered with the silicon carbide film 21. The silicon carbide film 21 is, for example, SiC or SiOC. The silicon carbide film 21 having low step coverage ability is used and, therefore, the inlet of the current inhibition groove 13 is closed by the silicon carbide film 21 before the space in the current inhibition groove 13 is filled with the silicon carbide film 21. Formation of the silicon carbide film 21 may be performed in the step before the drain electrode 61 is formed or may be performed in the step after the drain electrode 61 is formed.

In the above description, the drain electrode forming groove 12 and the current inhibition groove 13 are formed having the same level of depths. However, the drain electrode forming groove 12 may be formed more deeply than is the current inhibition groove 13. Subsequently, the protective film 60 and the drain electrode 61 may be formed in the inside of the deeply formed drain electrode forming groove 12.

Figure 14:
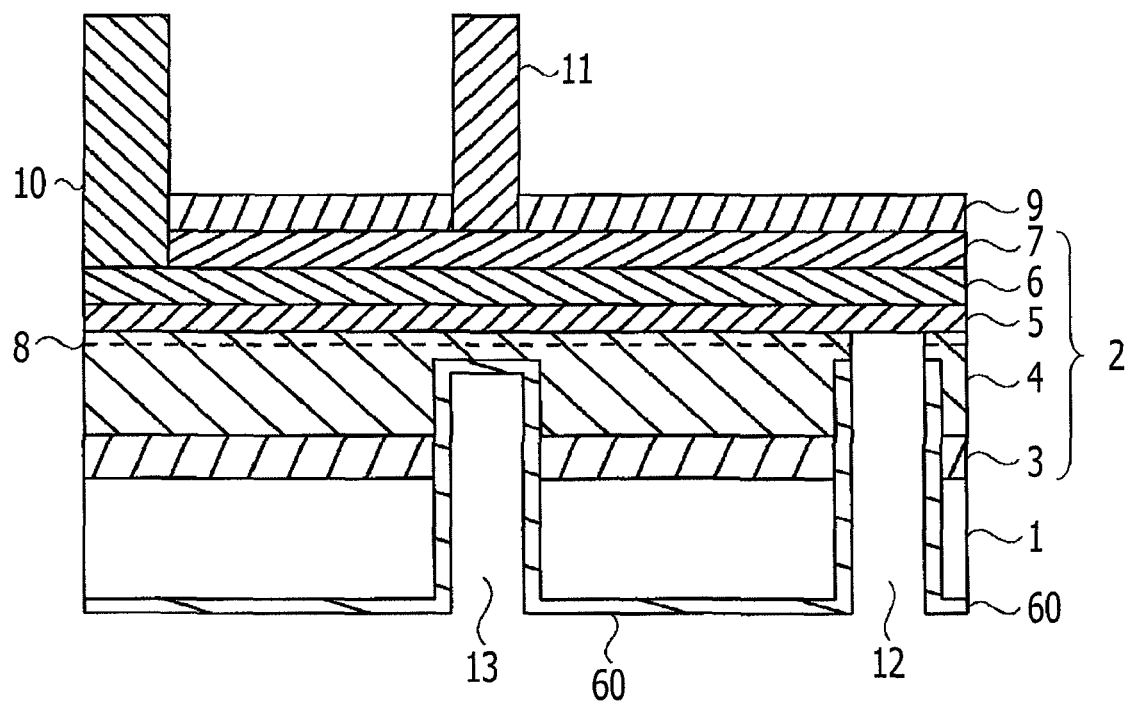
FIG. 14 is a sectional view of the semiconductor device according to the fourth embodiment in the case where a drain electrode forming groove is formed more deeply than is the current inhibition groove.

For example, after the step explained with reference to FIG. 12A is performed, a resist is applied to the back of the semiconductor substrate 1. A photomask is used, and ultraviolet rays are applied to the drain electrode 61 forming region, so that an opening is formed in the resist. The resist provided with the opening is used as a mask. The protective film 60 disposed on the bottom of the drain electrode forming groove 12 is removed and the drain electrode forming groove 12 is further dug through dry etching by using an inert gas and a chlorine based gas, e.g., a $Cl_2$ gas. As illustrated in FIG. 14, the drain electrode forming groove 12 is formed more deeply than is the current inhibition groove 13 by further digging the drain electrode forming groove 12. For example, the drain electrode forming groove 12 may penetrate the semiconductor substrate 1 and the core forming layer 3 and be terminated at the interface or in the vicinity of the interface between the spacer layer 5 and the carrier transit layer 4. Alternatively, the drain electrode forming groove 12 may penetrate the semiconductor substrate 1, the core forming layer 3, and the carrier transit layer 4 and may be terminated in the inside of the spacer layer 5.

Figure 15:
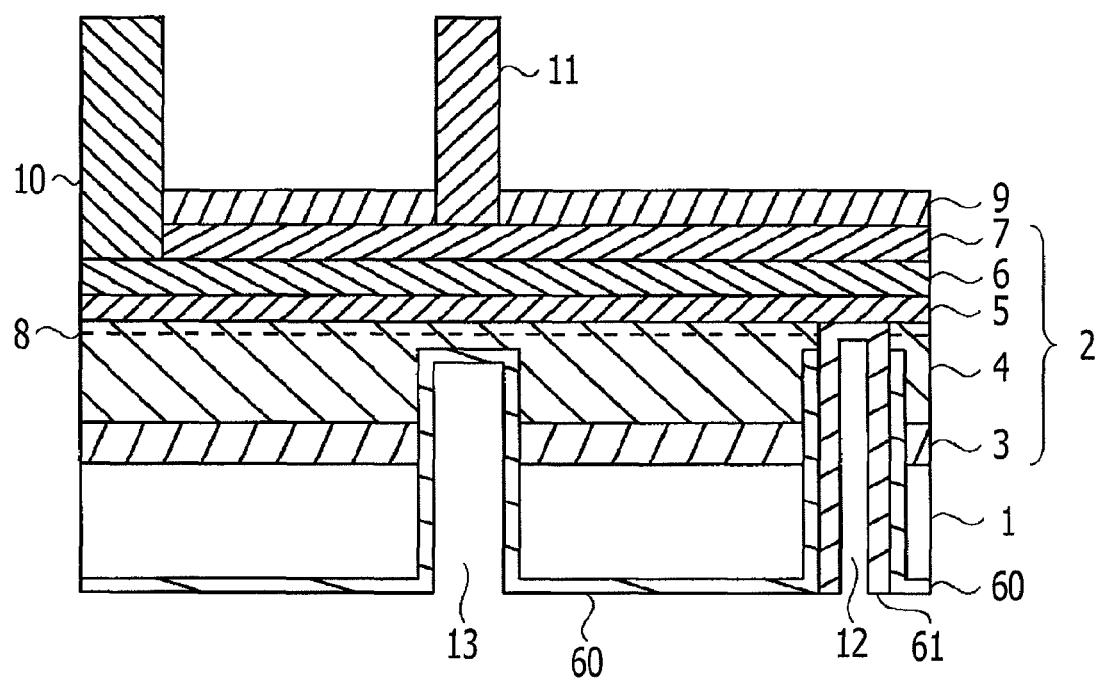
FIG. 15 is a sectional view of the semiconductor device according to the fourth embodiment in the case where a drain electrode is disposed in the deeply disposed drain electrode forming groove.
Figure 16:
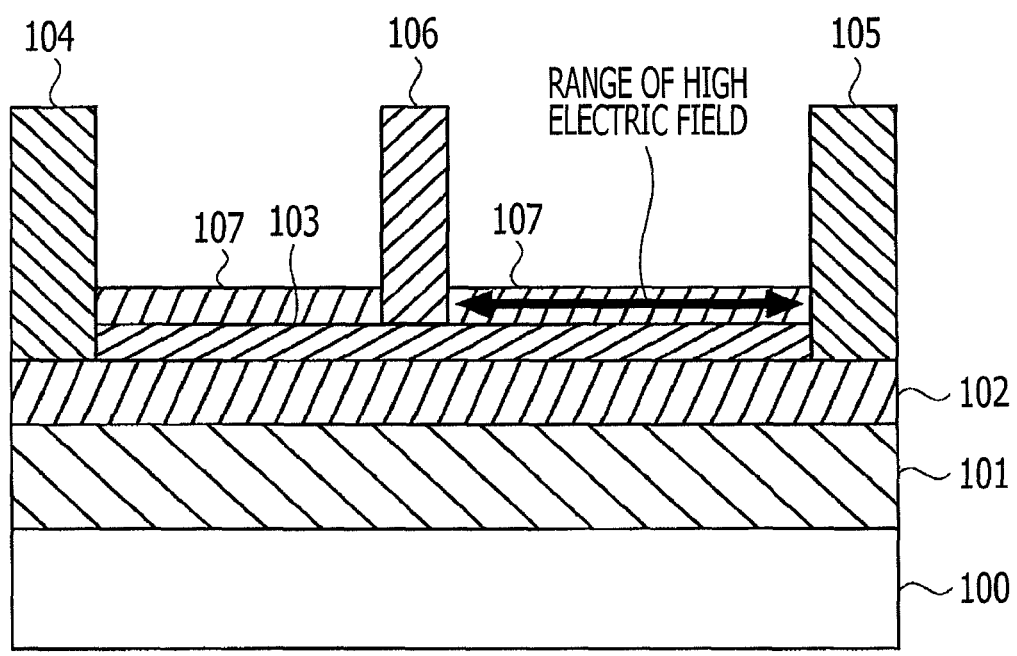
FIG. 16 is a diagram illustrating a semiconductor device having a HEMT structure according to the related art.

In the case where the drain electrode 61 is formed in the inside of the deeply formed drain electrode forming groove 12, the same step as the step explained with reference to FIG. 12C is performed. That is, in an atmosphere under reduced pressure, Ti and Al are formed in the deeply formed drain electrode forming groove 12 by the evaporation method. The film thickness of Ti is, for example, about 10 nm, and the film thickness of Al is, for example, about 200 nm. Subsequently, as illustrated in FIG. 15, the resist disposed on the back of the semiconductor substrate 1 is removed (lifted off) and, thereby, a drain electrode 61 is formed in the deeply formed drain electrode forming groove 12.

In the case where the drain electrode forming groove 12 is terminated at the interface between the spacer layer 5 and the carrier transit layer 4, the drain electrode 61 is formed up to the interface between the spacer layer 5 and the carrier transit layer 4. In the case where the drain electrode forming groove 12 is terminated in the vicinity of the interface between the spacer layer 5 and the carrier transit layer 4, the drain electrode 61 is formed up to the vicinity of the interface between the spacer layer 5 and the carrier transit layer 4. In the case where the drain electrode forming groove 12 penetrates the semiconductor substrate 1, the core forming layer 3, and the carrier transit layer 4 and where it is terminated in the inside of the spacer layer 5, the drain electrode 61 is formed up the inside of the spacer layer 5.

The position of formation of the current inhibition groove 13 may be changed as described below. For example, the current inhibition groove 13 may be formed between the position just below the gate electrode 11 and the position, at which the drain electrode 61 is disposed. In the case where the current inhibition groove 13 is formed between the position just below the gate electrode 11 and the position, at which the drain electrode 61 is disposed, a current is prevented from passing into the drain electrode 61 when the transistor is off, as in the case where the current inhibition groove 13 is formed at the position just below the gate electrode 11.

Alternatively, the position of formation of the current inhibition groove 13 can be brought close to the direction of the position just below the source electrode 10. However, if the distance between the depletion layer generated just below the gate electrode 11 and the current inhibition groove 13 is too large, a current may pass between the depletion layer generated just below the gate electrode 11 and the current inhibition groove 13. Therefore, in the case where the position of formation of the current inhibition groove 13 is brought close to the direction of the position just below the source electrode 10, it is preferable that the current inhibition groove 13 is formed at the position adjacent to the position just below the gate electrode 11.

The semiconductor devices according to the first to fourth embodiments may be MIS gate type semiconductor devices in which an insulating film of $Al_2O_3$, $Ta_2O_5$, or the like is disposed between the cap layer 7 and the gate electrode 11.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A method for manufacturing a semiconductor device, comprising:
   forming a carrier transit layer above a substrate;
   forming a compound semiconductor layer on the carrier transit layer;
   forming a source electrode and a gate electrode on the compound semiconductor layer;
   forming a first groove and a second groove in the substrate and the carrier transit layer; and
   forming a drain electrode in the inside of the first groove,
   wherein the gate electrode is located between the source electrode and the first groove,
   the first groove is disposed from a back of the substrate up to an inside of the carrier transit layer while penetrating the substrate, and
   the second groove is located between the source electrode and the first groove and is disposed from the back of the substrate up to another inside of the carrier transit layer while penetrating the substrate.

2. The method for manufacturing a semiconductor device, according to claim 1,
   wherein the drain electrode is disposed at an interface or in the vicinity of an interface between the compound semiconductor layer and the carrier transit layer.

3. The method for manufacturing a semiconductor device, according to claim 1,
   wherein the first groove and the second groove are formed at the same time.

4. The method for manufacturing a semiconductor device, according to claim 1, further comprising:
   forming an insulating film on a side surface of the drain electrode.

5. The method for manufacturing a semiconductor device, according to claim 1, further comprising:
   forming a stopper layer between the substrate and the carrier transit layer,
   wherein in the forming of the first groove and the second groove in the substrate and the carrier transit layer, a first etching of forming a third groove and a fourth groove from the back of the substrate up to the stopper layer while penetrating the substrate and a second etching of forming the first groove and the second groove by further digging the third groove and the fourth groove are included and
   wherein an etching rate in the second etching is smaller than an etching rate in the first etching.

* * * * *